US008255754B2

(12) United States Patent
Tsfati et al.

(10) Patent No.: US 8,255,754 B2
(45) Date of Patent: Aug. 28, 2012

(54) RANGE EXTENSION AND NOISE MITIGATION FOR WIRELESS COMMUNICATION LINKS UTILIZING A CRC BASED SINGLE AND MULTIPLE BIT ERROR CORRECTION MECHANISM

(75) Inventors: Yossi Tsfati, Rishon Letzion (IL); Gregory Lerner, Petach Tikva (IL); Eli Dekel, Tzur Igal (IL); Itay Sherman, Ra'anana (IL)

(73) Assignee: Texas Instruments Incorporated, Dallas, TX (US)

(*) Notice: Subject to any disclaimer, the term of this patent is extended or adjusted under 35 U.S.C. 154(b) by 1032 days.

(21) Appl. No.: 12/118,888

(22) Filed: May 12, 2008

(65) Prior Publication Data

US 2008/0288845 A1 Nov. 20, 2008

Related U.S. Application Data

(60) Provisional application No. 60/930,299, filed on May 15, 2007.

(51) Int. Cl.
*H04L 1/18* (2006.01)
(52) U.S. Cl. ........................................ 714/748
(58) Field of Classification Search .................. 714/748
See application file for complete search history.

(56) References Cited

U.S. PATENT DOCUMENTS

| | | | | |
|---|---|---|---|---|
| 5,321,704 A * | 6/1994 | Erickson et al. | ............... | 714/781 |
| 5,481,566 A * | 1/1996 | Kulesa | ........................... | 375/259 |
| 6,003,151 A * | 12/1999 | Chuang | ........................... | 714/752 |
| 6,809,598 B1 | 10/2004 | Staszewski et al. | | |
| 6,981,195 B2 * | 12/2005 | Newcombe et al. | .......... | 714/758 |
| 7,426,679 B2 * | 9/2008 | Gorshe | ........................ | 714/785 |
| 7,607,071 B2 * | 10/2009 | Neefs et al. | .................... | 714/785 |
| 8,032,817 B2 * | 10/2011 | Ngo | ............................. | 714/781 |
| 2002/0046382 A1 * | 4/2002 | Yang | ............................. | 714/758 |
| 2004/0153945 A1 * | 8/2004 | Takami | ........................ | 714/758 |
| 2005/0257118 A1 * | 11/2005 | Shien | ........................... | 714/758 |
| 2006/0033582 A1 | 2/2006 | Staszewski et al. | | |
| 2006/0038710 A1 | 2/2006 | Staszewski et al. | | |
| 2008/0022185 A1 * | 1/2008 | Kiryu | ............................. | 714/759 |
| 2008/0288845 A1 * | 11/2008 | Tsfati et al. | ................... | 714/748 |
| 2009/0006922 A1 * | 1/2009 | Yoshida | ........................ | 714/755 |

* cited by examiner

*Primary Examiner* — Amine Riad
(74) *Attorney, Agent, or Firm* — Alan A. R. Cooper; Wade James Brady, III; Frederick J. Telecky, Jr.

(57) ABSTRACT

A novel and useful range extension and in-band noise mitigation mechanism that uses conventional CRC error detection codes to correct single and multiple bit errors in packets received over a communications link. The CRC error correction mechanism of the invention is particularly suitable for use with communication protocols with weak error correction capabilities. The mechanism uses the linearity property of the CRC calculation to detect the existence of errors in the received packet. The entire received packet is searched for single bit errors and are corrected in a single cycle. If no single bit errors are found, the mechanism then searches for multiple bit errors. Packet retransmissions are used to detect and mark the location of multiple bit errors. Multiple bit errors are corrected by trying a plurality of hypotheses of single bit error corrections. Each hypotheses pattern is investigated to find matching CRC patterns for correction using the single bit, single cycle CRC error correction method.

20 Claims, 16 Drawing Sheets

RANGE EXTENSION AND NOISE MITIGATION FOR WIRELESS COMMUNICATION LINKS UTILIZING A CRC BASED SINGLE AND MULTIPLE BIT ERROR CORRECTION MECHANISM

REFERENCE TO PRIORITY APPLICATION

This application claims priority to U.S. Provisional Application Ser. No. 60/930,299, filed May 15, 2007, entitled "Novel scheme for range extension for bluetooth," incorporated herein by reference in its entirety.

FIELD OF THE INVENTION

The present invention relates to the field of data communications and more particularly relates to a mechanism for extending the range and mitigating the noise of wireless communication links using CRC based single and multiple bit error correction techniques.

BACKGROUND OF THE INVENTION

Currently, demand in increasing for converged mobile devices which combine data and telephony capabilities. Technological advances such as extremely low power consumption, improvements in form factor, pricing and co-existence technology for 802.11 (WLAN) and Bluetooth are fueling the demand.

Wireless communication devices such as WLAN and Bluetooth devices are generally constrained to operate in a certain frequency band of the electromagnetic spectrum. The use of frequency bands is licensed by government regulatory agencies, for example, the U.S. Federal Communications Commission (FCC) and the European Radio Communications Office. Licensing is necessary in order to prevent interference between multiple broadcasters trying to use the same frequency band in an area.

Regulatory agencies also specify frequency bands for devices that emit radio frequencies, where licensing is not required. Wireless communication devices using these unlicensed frequency bands generally transmit at low power over a small area. The Industrial, Scientific, or Medical equipment (ISM) band is one such frequency band located between 2.4 and 2.5 GHz. This 2.4 GHz band is used by many wireless communication devices for data and/or voice communication networks.

An example of such a network is defined by the Bluetooth specification. Bluetooth specifies communication protocols for low cost, low power wireless devices that operate over a very small area, the so-called, personal area network. These wireless devices may include, for example, telephone headsets, cell phones, Internet access devices, personal digital assistants, laptop computers, etc. The Bluetooth specification effectively replaces cables used to connect communicating devices, for example, a cell phone and a headset, with a wireless radio link to provide greater ease of use by reducing the tangle of wires frequently associated with personal communication systems. Several such personal communication devices may be wirelessly linked together by using the Bluetooth specification, which derives its name from Harald Blatand (Blatand is Danish for Bluetooth), a 10th century Viking king who united Denmark and Norway.

Bluetooth is an industrial specification for wireless personal area networks (PANs). Bluetooth provides a way to connect and exchange information between devices such as mobile phones, printers, PCs, laptops, and other digital equipment, over a secure, globally unlicensed short-range radio frequency (RF).

Bluetooth is a radio standard and communications protocol primarily designed for low power consumption, with a short range based on low-cost transceiver integrated circuits (ICs) in each device. Bluetooth networks enable these devices to communicate with each other when they are in range.

Bluetooth capability is increasingly built-in to many new products such as phones, printers, modems and headsets. Bluetooth is appropriate for situations when two or more devices are in proximity to each other and do not require high bandwidth. Bluetooth is most commonly used with phones and hand-held computing devices, either using a Bluetooth headset or transferring files from phones/PDAs to computers.

Bluetooth also simplified the discovery and setup of services, in contrast to WLAN which is more analogous to a traditional Ethernet network and requires configuration to set up shared resources, transmit files, set up audio links (e.g., headsets and hands-free devices), whereas Bluetooth devices advertise all the services they provide; thus making the service more accessible, without the need to worry about network addresses, permissions, etc.

Because Bluetooth devices operate in the unlicensed 2.4 GHz RF band, they are subject to radio interference from other wireless devices operating in the same frequency band. To avoid RF interference, the Bluetooth specification divides the 2.4 to 2.5 GHz frequency band into 1 MHz-spaced channels. Each channel signals data packets at 1 Mb/s, using a Gaussian Frequency Shift Keying modulation scheme. A Bluetooth device transmits a modulated data packet to another Bluetooth device for reception. After a data packet is transmitted and received, both devices retune their radio to a different 1 MHz channel, effectively hopping from radio channel to radio channel, i.e., frequency-hopping spread spectrum (FHSS) modulation, within the 2.4 to 2.5 GHz frequency band. In this way, Bluetooth devices use most of the available 2.4 to 2.5 GHz frequency band and if a particular signal packet transmission/reception is compromised by interference on one channel, a subsequent retransmission of the particular signal packet on a different channel is likely to be effective.

Bluetooth devices operate in one of two modes: as a Master device or a Slave device. The Master device provides a network clock and determines the frequency hopping sequence. One or more Slave devices synchronize to the Master's clock and follow the Master's hopping frequency.

Bluetooth is a time division multiplexed system, where the basic unit of operation is a time slot of 625 microsecond duration. The Master device first transmits to the Slave device during a first time slot of 625 microseconds with both devices tuned to the same RF channel. Thus, the Master device transmits and the Slave device receives during the first time slot. Following the first time slot, the two devices retune their radios, or hop, to the next channel in the frequency hopping sequence for the second time slot. During the second time slot, the Slave device must respond whether it successfully understood, or not, the last packet transmitted by the Master during the first time slot. The Slave device thus transmits and the Master device receives during the second time slot. As a Slave device must respond to a Master's transmission, communication between the two devices requires at a minimum two time slots or 1.25 milliseconds.

Data packets, when transmitted over networks, are frequently susceptible to delays by, for example, retransmissions of packets caused by errors, sequence disorders caused by alternative transmission pathways, etc. Packet delays do not cause much of a problem with the transmission of digital data because the digital data may be retransmitted or resequenced by the receiver without effecting the operation of computer programs using the digital data. Packet delays or dropped packets during the transmission of voice signals, however, can cause unacceptable quality of service.

The Bluetooth specification version 1.1 provides a Synchronous Connection Oriented (SCO) link for voice packets that is a symmetric link between Master and Slave devices with periodic exchange of voice packets during reserved time slots. The Master device transmits SCO packets to the Slave device at regular intervals, defined as the SCO interval or $T_{SCO}$, which is counted in time slots. Bandwidth limitations limit the Bluetooth specification to a maximum of three SCO links. Therefore, the widest possible spacing for an SCO pair of time slots, which are sometimes called a voice slot, is every third voice slot. Bluetooth specification version 1.2 provides enhanced SCO links, i.e. eSCO links, which have a larger voice slot size, based on $N*625$ microsecond time slots, with larger and configurable intervals between voice slots. These eSCO links can be used for both voice or data applications.

The Institute of Electronic and Electrical Engineer (IEEE) 802.11 specification for Wireless Local Area Networks (WLANs) is also a widely used specification that defines a method of RF modulation, i.e. direct sequence spread spectrum (DSSS) and/or high-rate direct sequence spread spectrum (HR/DSSS), which also uses the same 2.4 GHz RF band as Bluetooth devices. Radio interference occurs when Bluetooth and WLAN devices try to communicate simultaneously over the same RF band.

Direct-sequence modulation is a spread spectrum technique used to transmit a data packet over a wide frequency band. The RF energy is spread over a wide band in a mathematically controlled way. Changes in the radio carrier are present across a wide band and receivers perform correlation processes to look for changes. Correlation provides DSSS and HR/DSSS transmissions excellent protection against radio interference because noise tends to take the form of relatively narrow pulses that do not produce coherent effects across the entire frequency band. Hence, the correlation function spreads out the noise across the band, while the correlated signal shows a much greater signal amplitude. Direct-sequence modulation trades bandwidth for throughput.

WLANs can operate as independent networks, in which stations, e.g., laptop computers, communicate directly with each other, or as infrastructure networks that comprise stations, which are radio linked to a wired backbone network, e.g., Ethernet, by an access point. An access point that is associated with one or more stations forms an infrastructure service set, which provides network services to an infrastructure basic service area. All communication between stations in an infrastructure service set must go through an access point. Each station, at any point in time, is only associated with one access point. If a station, i.e. the source, in an infrastructure service set needs to communicate with another station, i.e. the destination, the source station first transmits by radio a data packet to its access point. The access point receives the radio transmission and then transmits the data packet to the destination station.

Several access points can be linked to a wired backbone network to form an extended service set comprising multiple infrastructure service sets and forming a corresponding extended service area. Access points are typically located along the wired backbone network forming overlapping infrastructure service areas, allowing for movement of a station from one infrastructure service area to another infrastructure service area without loss of communication between other stations of the extended service set.

Access points, which derive their power from the wired backbone network, assist stations, which are typically battery-powered, to save power. Access points remember when a station enters a power-saving mode, i.e. a sleep state, and buffer packets directed to the sleeping station. Battery-powered stations can therefore turn their wireless transceiver off and power up only to transmit and retrieve buffered data packets from the access point. The mobile station power saving mode is one of the most important features offered by an infrastructure network.

WLANs manage the communication of information from stations to a network in order for stations in search of connectivity to locate a compatible wireless network, to authenticate a mobile station for connection to a particular wireless network and to associate a mobile station with a particular access point to gain access to the wired backbone network. These management communications are defined under the WLAN specification by the Media Access Control (MAC). The MAC includes a large number of management frames that communicate network management functions, e.g., a Request for Association from a station to an access point, in an infrastructure network.

A station locates an existing WLAN network by either passive scanning or active scanning. Passive scanning saves battery power because it does not require transmitting. The station awakens from a sleep mode and listens or scans for a Beacon management frame, which broadcasts the parameters and capabilities of an infrastructure network from an access point. From the traffic indication map of the Beacon frame, the station determines if an access point has buffered traffic on its behalf. To retrieve buffered frames, the station uses a Power Save (PS)-Poll control frame. Active scanning requires that the station actively transmit a Probe Request frame to solicit a response from an infrastructure network with a given name and of known parameters and capabilities. After determining that a responding network of a given name and of known parameters and capabilities is present, the station sequentially joins, authenticates and requests an association with the responding network by transmitting an Association Request management frame. After receipt of the Association Request frame, an access point responds to the station with an Association Response management frame and the station now has access to the wired backbone network and its associated extended service area.

Management frames, such as an Association Request from a station, or an Association Response, a Beacon and a Probe Response from an access point, include a MAC header, a frame body containing information elements and fixed fields and a frame check sequence. Information elements are variable-length components of management frames that contain information about the parameters and capabilities of the network's operations. A generic information element has an ID number, a length, and a variable-length component. Element ID numbers are defined by IEEE standards for some of the 256 available values, other values are reserved. The value 221 is used for vendor specific extensions and is used extensively in the industry.

As Bluetooth personal area networks and WLANs use the same ISM RF band of 2.4 GHz to 2.5 GHz, radio interference between the different devices can degrade network communications, e.g., decreased data throughput and quality of voice service caused by retransmissions resulting from interference.

In connection with Bluetooth systems, Bluetooth networks have a limited range which is significantly reduced in dynamic flat fading environments. Since most packet types of Bluetooth have no forward error correction, the majority of Bluetooth communication traffic is very sensitive to noise wherein even the loss of a single bit causes an entire packet to be defective. Further, the ISM frequency band is inherently populated with interferences such as cordless phones, microwave ovens and WLAN equipment causing partial or complete information loss.

In connection with WLAN systems, WLAN network solutions have a limited range. Their range is significantly reduced in home/office environments as well as due to the presence of interferences such as Bluetooth and cordless phones operating in the 2.4 GHz frequency range.

Prior art solutions attempt to extend the wireless link range by increasing the output power and LNA sensitivity. Disadvantages of this include that it mainly used in access points, it increases power consumption and the cost of the solution and is not applicable for mobile applications.

Other solutions to range extension are based on proprietary coding and FEC schemes. The disadvantage of these (for WLAN systems) is that the solution must be implemented on both ends of the wireless link and the scheme is not relevant for mobile applications where operation with any standard based Access point or Station is required.

It is thus desirable to have a mechanism capable of extending the range of wireless networks (e.g., Bluetooth and WLAN networks, etc.) so as to provide more complete coverage for the delivery of data, voice and other services. It is further desirable that the mechanism be able to extend noise mitigation to in-band pulse interference as well.

SUMMARY OF THE INVENTION

The present invention is a novel and useful range extension and in-band noise mitigation mechanism that uses conventional CRC error detection codes to correct single and multiple bit errors in packets received over a communications link. The CRC error correction mechanism of the invention is particularly suitable for use in numerous standard wired and wireless protocols such as Bluetooth, WLAN, GPRS or any protocol that generates and sends CRC codes and has retransmission capability. In general, the mechanism is well suited for use with communication protocols with weak error correction capabilities.

In operation, the mechanism takes advantage of the linearity property of the CRC calculation to detect the existence of errors in the received packet. The mechanism is operative to use the packet CRC error detection code as an error correction code. The mechanism is first applied to single bit errors by searching the entire packet (which can be any length). Any single bit errors detected are corrected in a single cycle. If no single bit errors are found, the mechanism then searches for multiple bit errors. The retransmission capability of the communications protocol is used to detect and mark the location of multiple bit errors. Multiple bit errors are corrected by trying a plurality of hypotheses of single bit error corrections, thus improving the probability of reception. Each hypotheses pattern is investigated to find matching CRC patterns for correction using the single bit, single cycle CRC error correction method.

Advantages of the CRC error correction mechanism include (1) the mechanism can be implemented entirely in device firmware (layers 2 and 3) thus not requiring complex changes to the PHY; (2) provides approximately 4-6 dB improvement in sensitivity for voice and data traffic compared to standard based retry schemes; (3) provides significant improvement to Bluetooth coexistence performance eliminating disconnects and reducing rate fall-back scenarios; (4) provides immunity to burst noise such as created by Bluetooth or 2.4 GHz cordless phones; (5) the mechanism is interoperable with standard based WLAN Access Points and Stations; and (6) use of the mechanism mitigates the PER/BER floor.

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application. Specific Integrated Circuit (ASIC) or Field Programmable Gate Array (FPGA), or as functionally equivalent discrete hardware components.

There is thus provided in accordance with the invention, a method of extending the range of a wireless communications link, the method comprising the step of using a packet cyclic redundancy check (CRC) error detection code as an error correction code to correct one or more bit errors in a received packet.

There is also provided in accordance with the invention, a method of correcting single bit errors in a received packet, the method comprising the steps of calculating a cyclic redundancy check (CRC) code for the received packet, XORing a received CRC code with the calculated CRC code to yield an XOR result therefrom, determining a bit error location in accordance with the XOR result and flipping the value of the bit at the bit error location in the received packet thereby correcting the single bit error.

There is further provided in accordance with the invention, a method of correcting single bit errors in a received packet, the method comprising the steps of calculating a cyclic redundancy check (CRC) code for the received packet, XORing the calculated CRC code with a plurality of single bit error CRC correction values to generate a plurality of XOR results therefrom, wherein each CRC correction value corresponds to a single bit packet error, searching for a match between each XOR result and a received CRC code and if a match is found, flipping the value of the bit at a bit location in the received packet corresponding to the bit number of the matching XOR result thereby correcting the single bit error.

There is also provided in accordance with the invention, a method of correcting one or more bit errors in a received packet, the method comprising the steps of calculating a cyclic redundancy check (CRC) code for an initial received packet, utilizing a retransmitted packet to detect the presence of one or more bit errors, generating a plurality of hypotheses to check, each hypothesis represented by a CRC value, XORing the calculated CRC code with the CRC value associated with each hypothesis to generate a plurality of XOR results therefrom, searching for a match between the plurality of XOR results and a received CRC code and if a match is found, flipping the value of the bit at one or more bit locations in the initial received packet corresponding to one or more bit numbers of a matching XOR result thereby correcting the one or more bit errors.

There is further provided in accordance with the invention, a method of correcting multiple bit errors in a received packet, the method comprising the steps of calculating a cyclic redundancy check (CRC) code for an initial received packet, utilizing a retransmitted packet to detect the presence of multiple bit errors, generating a plurality of hypotheses to check, each hypothesis represented by a CRC value, for each bit position in the received packet, XORing the CRC value of each hypothesis with both a single bit error CRC correction value associated with a particular bit position and the calculated CRC code to generate XOR results therefrom, searching for a match between the plurality of XOR results and a received CRC code for each bit position in the received packet and if a match is found, flipping the value of the bit at the bit location in the initial received packet corresponding to the location of the matching tested bit and the value of one or more bits corresponding to the matching hypothesis thereby correcting the multiple bit errors.

There is also provided in accordance with the invention, a software program product embodied in a computer-readable medium, comprising program instructions executable to implement a range extension and noise mitigation mechanism operative to use a packet cyclic redundancy check (CRC) error detection code as an error correction code to correct one or more bit errors in a received packet.

There is further provided in accordance with the invention, a single chip radio controller comprising a radio for establishing a link to a remote device and a range extension and noise mitigation mechanism operative to use a packet cyclic redundancy check (CRC) error detection code as an error correction code to correct one or more bit errors in a received packet.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
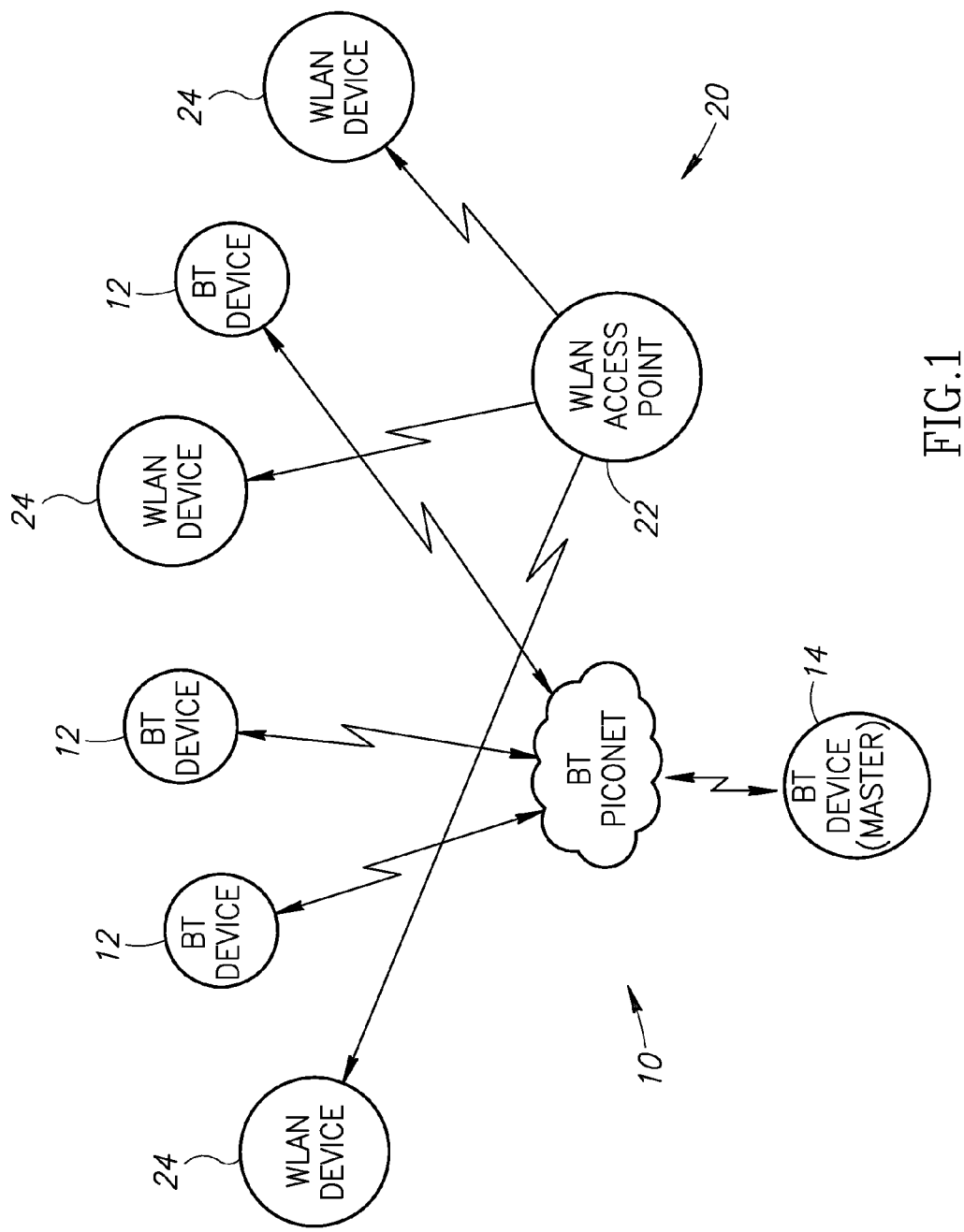
FIG. 1 is a block diagram illustrating an example prior art Bluetooth piconet and Wireless Local Area Network (WLAN)

The following notation is used throughout this document.

| Term | Definition |
| --- | --- |
| AC | Alternating Current |
| ADC | Analog to Digital Converter |
| ADPLL | All Digital Phase Locked Loop |
| ASIC | Application Specific Integrated Circuit |
| AVI | Audio Video Interface |
| BER | Bit Error Rate |
| BIST | Built-In Self Test |
| BMP | Windows Bitmap |
| BPF | Band Pass Filter |
| CAM | Content Addressable Memory |
| CMOS | Complementary Metal Oxide Semiconductor |
| CPU | Central Processing Unit |
| CRC | Cyclic Redundancy Check |
| DBB | Digital Baseband |
| DC | Direct Current |
| DCO | Digitally Controlled Oscillator |
| DCXO | Digitally Controlled Crystal Oscillator |
| DPA | Digitally Controlled Power Amplifier |
| DRAC | Digital to RF Amplitude Conversion |
| DRP | Digital RF Processor or Digital Radio Processor |
| DSL | Digital Subscriber Line |
| DSP | Digital Signal Processor |
| DSSS | Direct Sequence Spread Spectrum |
| EDGE | Enhanced Data Rates for GSM Evolution |
| EPROM | Erasable Programmable Read Only Memory |
| FCC | Federal Communications Commission |
| FCW | Frequency Command Word |
| FEC | Forward Error Correction |
| FEM | Front End Module |
| FM | Frequency Modulation |
| FPGA | Field Programmable Gate Array |
| GMSK | Gaussian Minimum Shift Keying |
| GPS | Global Positioning System |
| GSM | Global System for Mobile communications |
| HDL | Hardware Description Language |
| HR | High Rate |
| IC | Integrated Circuit |
| IEEE | Institute of Electrical and Electronics Engineers |
| IF | Intermediate Frequency |
| ISM | Industrial, Scientific, Medical |
| JPG | Joint Photographic Experts Group |
| LAN | Local Area Network |
| LDO | Low Drop Out |
| LNA | Low Noise Amplifier |
| LO | Local Oscillator |
| MAC | Media Access Control |
| MP3 | MPEG-1 Audio Layer 3 |
| MPG | Moving Picture Experts Group |
| MS | Mobile Station |
| NVS | Non-Volatile Storage |
| OFDMA | Orthogonal Frequency Division Multiple Access |
| PA | Power Amplifier |
| PAN | Personal Area Network |
| PC | Personal Computer |
| PDA | Personal Digital Assistant |
| PER | Packet Error Rate |
| PLL | Phase Locked Loop |
| PM | Power Management |
| PM | Phase Modulation |
| PPA | Pre-Power Amplifier |
| PS | Power Save |
| RAM | Random Access Memory |
| RAT | Radio Access Technology |

-continued

| Term | Definition |
|---|---|
| RF | Radio Frequency |
| RFBIST | RF Built-In Self Test |
| ROM | Read Only Memory |
| SAW | Surface Acoustic Wave |
| SIM | Subscriber Identity Module |
| SoC | System on Chip |
| SRAM | Static Read Only Memory |
| TDC | Time to Digital Converter |
| TV | Television |
| UMTS | Universal Mobile Telecommunications System |
| USB | Universal Serial Bus |
| UWB | Ultra Wideband |
| WCDMA | Wideband Code Division Multiple Access |
| WiFi | Wireless Fidelity |
| WiMAX | Worldwide Interoperability for Microwave Access |
| WiMedia | Radio platform for UWB |
| WLAN | Wireless Local Area Network |
| WMA | Windows Media Audio |
| WMV | Windows Media Video |
| WPAN | Wireless Personal Area Network |

Detailed Description of the Invention

The present invention is a novel and useful range extension and in-band noise mitigation mechanism that uses conventional CRC error detection codes to correct single and multiple bit errors in packets received over a communications link. The CRC error correction mechanism of the invention is particularly suitable for use in numerous standard wired and wireless protocols such as Bluetooth, WLAN, GPRS or any protocol that generates and sends CRC codes and has retransmission capability. In general, the mechanism is well suited for use with communication protocols with weak error correction capabilities.

In operation, the mechanism takes advantage of the linearity property of the CRC calculation to detect the existence of errors in the received packet. The mechanism is operative to use the packet CRC error detection code as an error correction code. The mechanism is first applied to single bit errors by searching the entire packet (which can be any length). Any single bit errors detected are corrected in a single cycle. If no single bit errors are found, the mechanism then searches for multiple bit errors. The retransmission capability of the communications protocol is used to detect and mark the location of multiple bit errors. Multiple bit errors are corrected by trying a plurality of hypotheses of single bit error corrections, thus improving the probability of reception. Each hypotheses pattern is investigated to find matching CRC patterns for correction using the single bit, single cycle CRC error correction method.

Although the CRC error correction mechanism is applicable to numerous wireless communication standards and can be incorporated in numerous types of wireless or wired communication devices such a multimedia player, mobile station, cellular phone, PDA, DSL modem, WPAN device, etc., it is described in the context of a digital RF processor (DRP) based transmitter that may be adapted to comply with a particular wireless communications standard such as GSM, Bluetooth, EDGE, WCDMA, WLAN, WiMax, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulations.

Note that throughout this document, the term communications device is defined as any apparatus or mechanism adapted to transmit, receive or transmit and receive data through a medium. The term communications transceiver or communications device is defined as any apparatus or mechanism adapted to transmit and receive data through a medium. The communications device or communications transceiver may be adapted to communicate over any suitable medium, including wireless or wired media. Examples of wireless media include RF, infrared, optical, microwave, UWB, Bluetooth, WiMAX, WiMedia, WiFi, or any other broadband medium, etc. Examples of wired media include twisted pair, coaxial, optical fiber, any wired interface (e.g., USB, Firewire, Ethernet, etc.). The term Ethernet network is defined as a network compatible with any of the IEEE 802.3 Ethernet standards, including but not limited to 10Base-T, 100Base-T or 1000Base-T over shielded or unshielded twisted pair wiring. The terms communications channel, link and cable are used interchangeably. The notation DRP is intended to denote either a Digital RF Processor or Digital Radio Processor. References to a Digital RF Processor infer a reference to a Digital Radio Processor and vice versa.

The term multimedia player or device is defined as any apparatus having a display screen and user input means that is capable of playing audio (e.g., MP3, WMA, etc.), video (AVI, MPG, WMV, etc.) and/or pictures (JPG, BMP, etc.). The user input means is typically formed of one or more manually operated switches, buttons, wheels or other user input means. Examples of multimedia devices include pocket sized personal digital assistants (PDAs), personal media player/recorders, cellular telephones, handheld devices, and the like.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

It should be born in mind that all of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention can take the form of an entirely hardware embodiment, an entirely software embodiment or an embodiment containing a combination of hardware and software elements. In one embodiment, a portion of the mechanism of the invention is implemented in software, which includes but is not limited to firmware, resident software, object code, assembly code, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium is any apparatus that can contain, store, communicate, propagate, or transport the program for use by or in connection with the instruction execution system, apparatus, or device, e.g., floppy disks, removable hard drives, computer files comprising source code or object code, flash semiconductor memory (USB flash drives, etc.), ROM, EPROM, or other semiconductor memory devices.

Single Chip Radio

Figure 2:
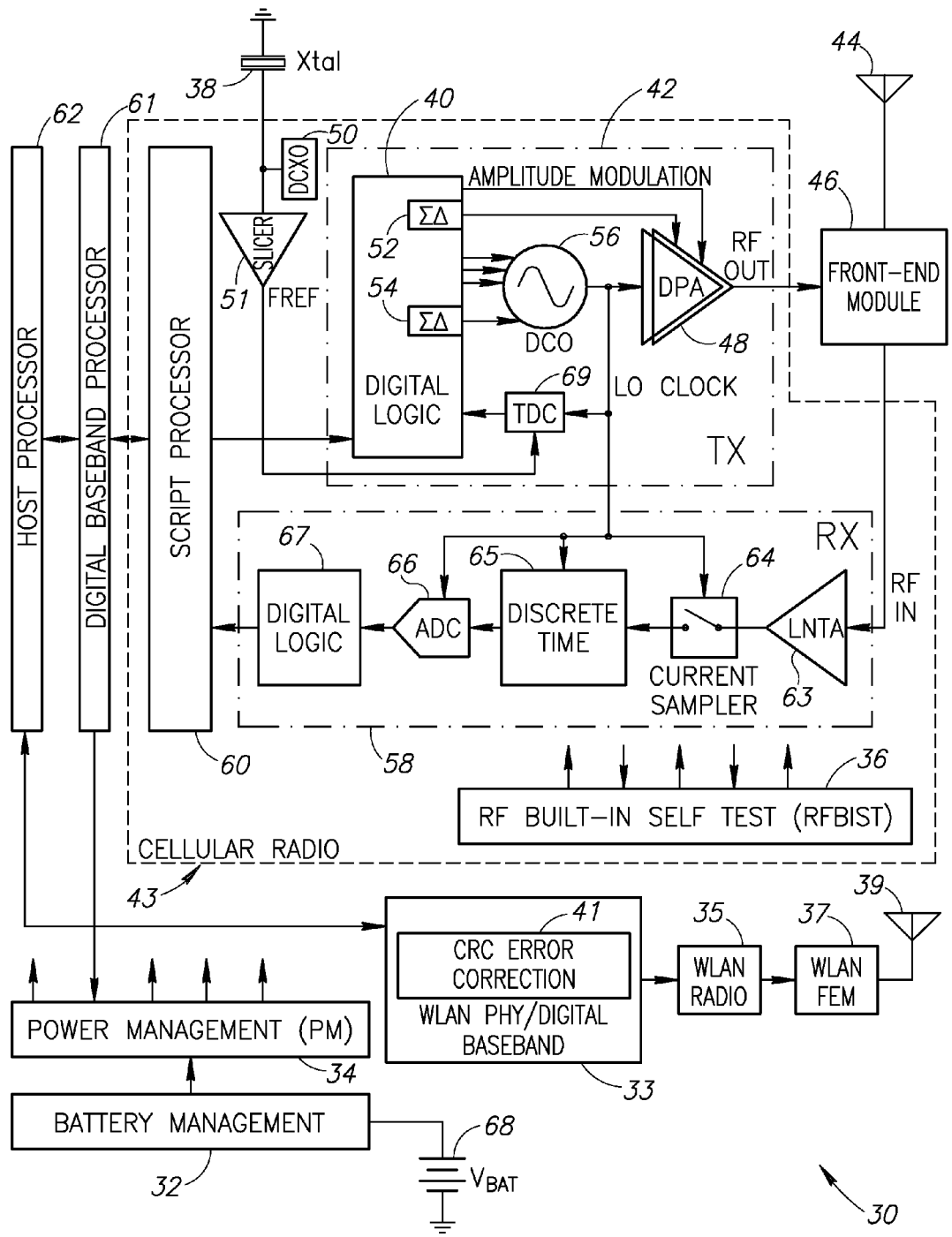
FIG. 2 is a block diagram illustrating a single chip polar transceiver radio coupled to a WLAN radio incorporating the CRC error correction mechanism of the present invention.

A block diagram illustrating a single chip polar transceiver radio coupled to a WLAN radio incorporating the CRC error correction mechanism of the present invention is shown in FIG. 2. For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The SoC radio circuit, generally referenced 30, comprises a cellular radio integrated circuit 43 coupled to a crystal 38, digital baseband (DBB) processor 61, host processor 62, cellular front end module 46 coupled to antenna 44, power management block 34, battery management circuit 32 coupled to battery 68 and WLAN transceiver 31 (excluding WLAN FEM 37). The cellular radio chip 43 comprises a script processor 60, memory (not shown) such as static RAM, TX block 42, RX block 58, digitally controlled crystal oscillator (DCXO) 50, slicer 51 and RF built-in self test (BIST) 36. The TX block comprises high speed and low speed digital logic block 40 including $\Sigma\Delta$ modulators 52, 54, digitally controlled oscillator (DCO) 56 and digitally controlled power amplifier (DPA) 48 (also referred to as the pre-power amplifier (PPA)). The ADPLL in the transmitter functions to generate various radio frequency signals. The RX block comprises a low noise transconductance amplifier 63, current sampler 64, discrete time processing block 65, analog to digital converter (ADC) 66 and digital logic block 67.

In accordance with the invention, the SoC also comprises WLAN transceiver 31 which comprises the WLAN digital baseband 33 including the CRC error correction block 41 of the present invention and WLAN radio 35. The transceiver also encompasses WLAN FEM 37 which is coupled to WLAN antenna 39. The WLAN FEM 37, however, typically is located external to the SoC in a separate IC. In operation, the WLAN digital baseband is operative to interface to the host processor 62. The CRC error correction block 41 is operative to implement the CRC based error correction mechanism which is operative to correct single and multiple bit errors using conventional CRC codes as described in more detail infra. Note that it is appreciated that the cellular radio 43 may be used in combination with radio technology other than WLAN, such as Bluetooth, etc. without departing from the scope of the invention.

The principles presented herein have been used to develop three generations of a Digital RF Processor (DRP): single-chip Bluetooth, GSM and GSM/EDGE radios realized in 130 nm, 90 nm and 65 nm digital CMOS process technologies, respectively. The common architecture is highlighted in FIG. 2 with features added specific to the cellular radio. In this example cellular radio, the all digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 56, which avoids any analog tuning controls. A digitally-controlled crystal oscillator (DCXO) generates a high-quality base station-synchronized frequency reference such that the transmitted carrier frequencies and the received symbol rates are accurate to within 0.1 ppm. Fine frequency resolution is achieved through high-speed $\Sigma\Delta$ dithering of its varactors. Digital logic built around the DCO realizes an all-digital PLL (ADPLL) that is used as a local oscillator for both the transmitter and receiver. The polar transmitter architecture utilizes the wideband direct frequency modulation capability of the ADPLL and a digitally controlled power amplifier (DPA) 300 for the amplitude modulation. The DPA operates in near-class-E mode and uses an array of nMOS transistor switches to regulate the RF amplitude and acts as a digital-to-RF amplitude converter (DRAC). It is followed by a matching network and an external cellular front-end module 46, which comprises a power amplifier (PA), a transmit/receive switch for the common antenna 44 and RX surface acoustic wave (SAW) filters. Fine amplitude resolution is achieved through high-speed $\Sigma\Delta$ dithering of the DPA nMOS transistors.

The receiver 58 employs a discrete-time architecture in which the RF signal is directly sampled at the Nyquist rate of the RF carrier and processed using analog and digital signal processing techniques. The transceiver is integrated with a script processor 60, dedicated digital base band processor 61 (i.e. ARM family processor or DSP), SRAM or other memory (not shown) and an interface to host processor 62. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz (could be 38.4 MHz or other) digitally controlled crystal oscillator (DCXO) 50 coupled to slicer 51. An integrated power management (PM) system 34 is connected to an external battery management circuit 32 that conditions and stabilizes the supply voltage. The PM comprises multiple low drop out (LDO) regulators that provide internal supply voltages and also isolate supply noise between circuits, especially protecting the DCO. The RF built-in self-test (RFBIST) 36 performs autonomous phase noise and modulation distortion testing, various loopback configurations for bit-error rate measurements and optionally implements a DPA calibration and BIST mechanism. The transceiver is integrated with the digital baseband, SRAM memory in a complete system-on-chip (SoC) solution. Almost all the clocks on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a CORDIC algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

Mobile Device Incorporating the CRC Error Correction Mechanism

Figure 3:
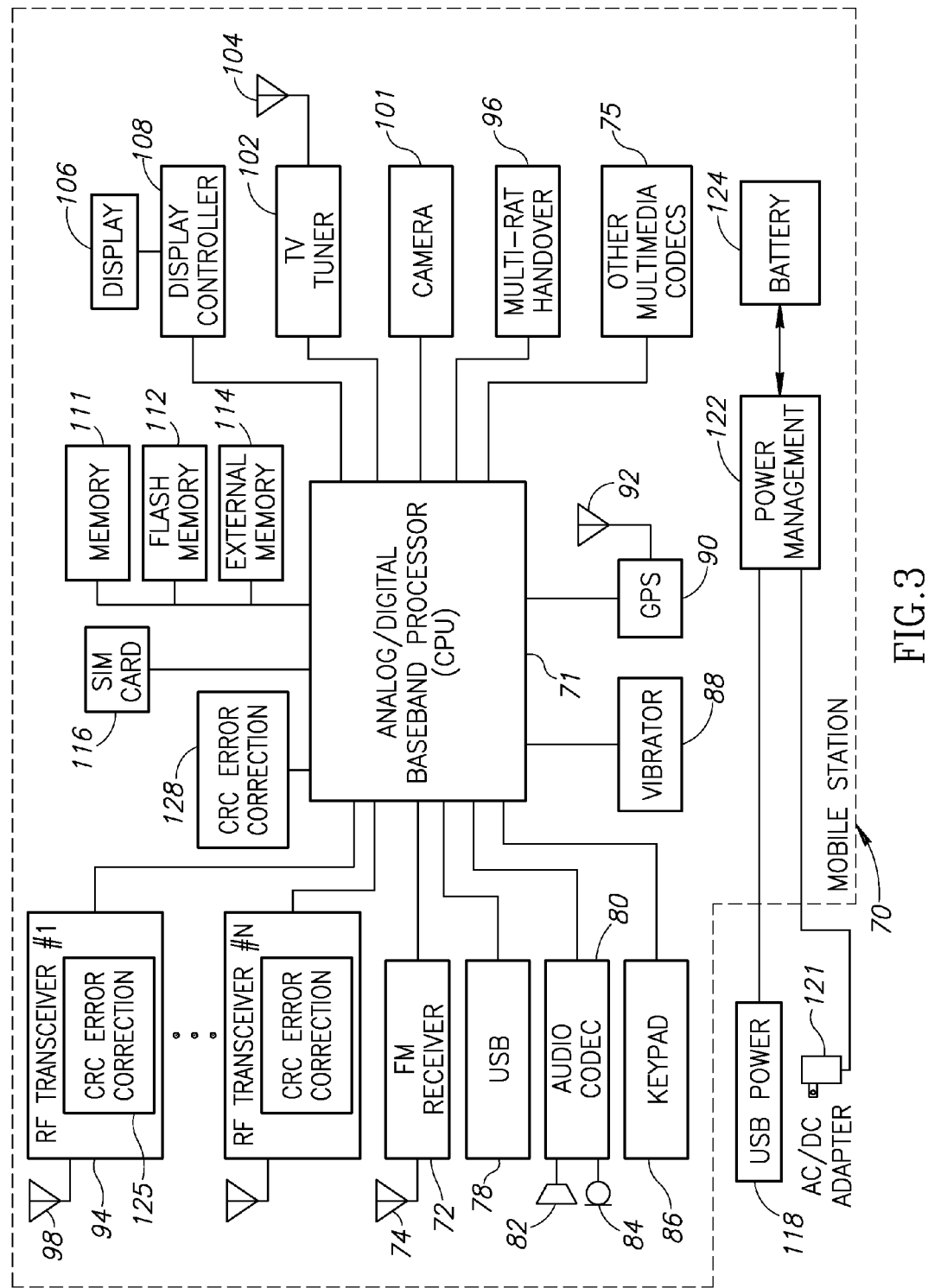
FIG. 3 is a block diagram illustrating an example communication device incorporating the CRC error correction mechanism of the present invention.

A general block diagram illustrating a communication device (shown generally as a mobile station or MS) incorporating the CRC error correction mechanism of the present invention is shown in FIG. 3. Note that the mobile station may comprise any suitable wired or wireless device such as multimedia player, mobile communication device, cellular phone, smartphone, PDA, Bluetooth device, etc. For illustration purposes only, the device is shown as a mobile station. Note that this example is not intended to limit the scope of the invention as the adaptive frequency hopping mechanism of the present invention can be implemented in a wide variety of communication devices.

The mobile station, generally referenced 70, comprises a baseband processor or CPU 71 having analog and digital portions. The MS may comprise a plurality of RF transceivers 94 and associated antennas 98. RF transceivers for the basic cellular link and any number of other wireless standards and radio access technologies (RATs) may be included. Examples include, but are not limited to, Global System for Mobile Communication (GSM)/GPRS/EDGE 3G; CDMA; WiMAX for providing WiMAX wireless connectivity when within the range of a WiMAX wireless network using OFDMA techniques; Bluetooth for providing Bluetooth wireless connectivity when within the range of a Bluetooth wireless network; WLAN for providing wireless connectivity when in a hot spot or within the range of an ad hoc, infrastructure or mesh based wireless LAN network; near field communications; 60 GHz device; UWB; etc. One or more of the RF transceivers may comprise a plurality of antennas to provide antenna diversity which yields improved radio performance. The mobile station may also comprise internal RAM and ROM memory 110, flash memory 112 and external memory 114.

Several user interface devices include microphone(s) 84, speaker(s) 82 and associated audio codec 80 or other multimedia codecs 75, a keypad for entering dialing digits 86, vibrator 88 for alerting a user, camera and related circuitry 100, a TV tuner 102 and associated antenna 104, display(s) 106 and associated display controller 108 and GPS receiver 90 and associated antenna 92. A USB or other interface connection 78 (e.g., SPI, SDIO, PCI, etc.) provides a serial link to a user's PC or other device. An FM receiver 72 and antenna 74 provide the user the ability to listen to FM broadcasts. SIM card 116 provides the interface to a user's SIM card for storing user data such as address book entries, etc. Note that the SIM card shown is intended to represent any type of smart card used for holding user related information such as identity and contact information, Authentication Authorization and Accounting (AAA), profile information, etc. Different standards use different names, for example, SIM for GSM, USIM for UMTS and ISIM for IMS and LTE.

The mobile station comprises CRC error correction blocks 125 which may be implemented in any number of the RF transceivers 94. Alternatively (or additionally), the CRC error correction block 128 may be implemented as a task executed by the baseband processor 71. The CRC error correction blocks 125, 128 are adapted to implement the CRC based error correction mechanism of the present invention as described in more detail infra. In operation, the CRC error correction blocks may be implemented as hardware, software or as a combination of hardware and software. Implemented as a software task, the program code operative to implement the CRC error correction mechanism of the present invention is stored in one or more memories 110, 112 or 114 or local memories within the baseband processor.

Portable power is provided by the battery 124 coupled to power management circuitry 122. External power is provided via USB power 118 or an AC/DC adapter 120 connected to the battery management circuitry which is operative to manage the charging and discharging of the battery 124.

SoC Transceiver

Figure 4:
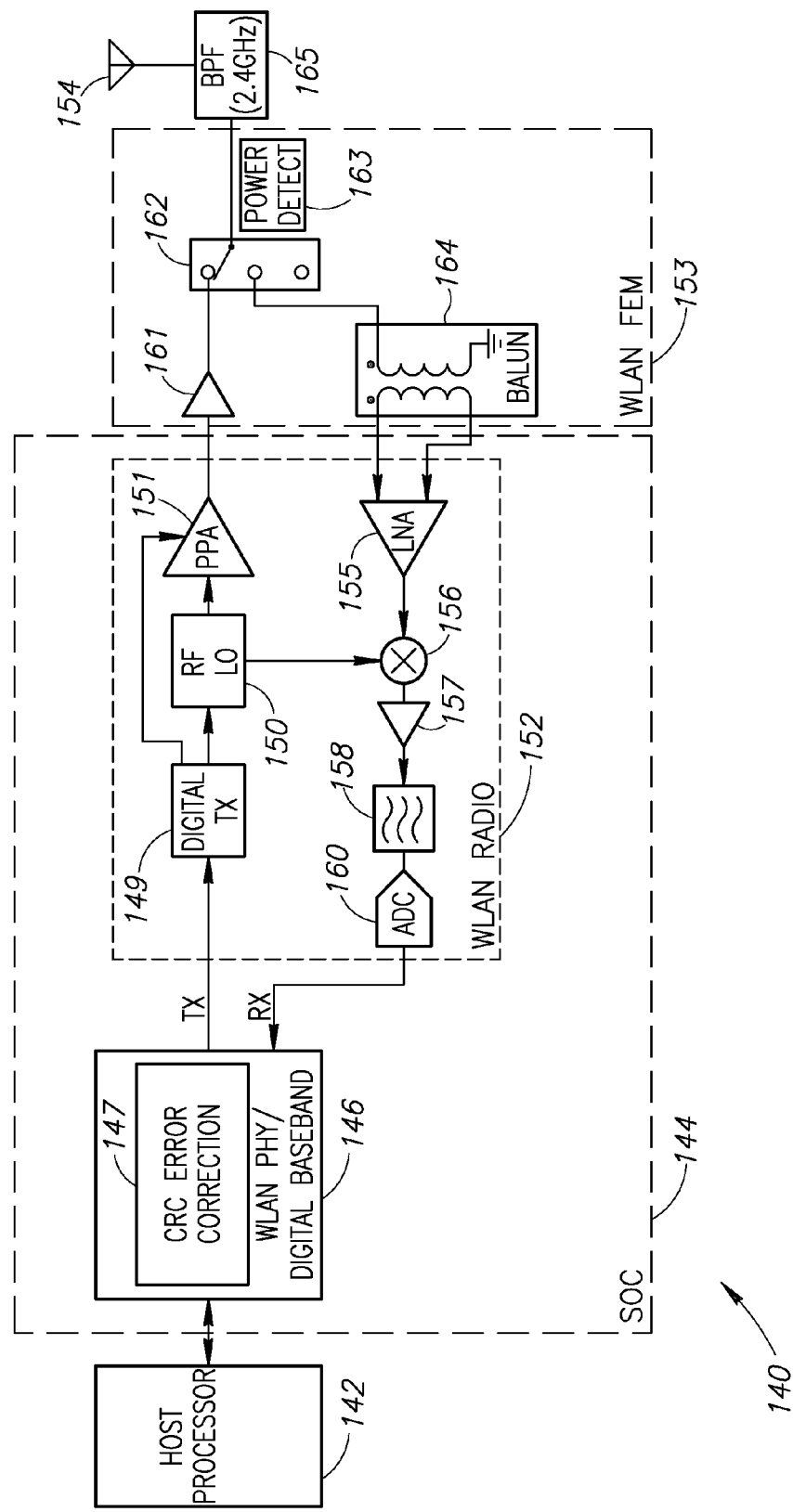
FIG. 4 is a block diagram illustrating an example SoC transceiver incorporating the CRC error correction mechanism of the present invention.

A block diagram illustrating the SoC transceiver incorporating the CRC error correction mechanism of the present invention is shown in FIG. 4. Note that for clarity sake, not all components are shown. The SoC and FEM circuit, generally referenced 140, comprises the SoC 144 coupled to host processor 142 and to WLAN FEM 153. The SoC 144 comprises WLAN PHY/digital baseband 146 including CRC error correction block 147, switch 148 and WLAN radio 152. The WLAN radio 152 comprises a digital transmitter 149, RF local oscillator (LO) 150 such as the ADPLL described supra and pre-power amplifier (PPA) 151 in the transmit path and LNA 155, downconverter (i.e. mixer) 156, amplifier 157, filter 158 and ADC 160 in the receive path. The WLAN FEM 153 comprises a power amplifier (PA) 161, switch 162, power detect circuit 163 and balun 164. The WLAN FEM is coupled to antenna 154 via band pass filter (BPF) 165.

Range Extension and Noise Mitigation Using the CRC Based Error Correction Mechanism The range of a wireless link along with in band noise mitigation is achieved by the present invention using a CRC based error correction mechanism. The mechanism uses the conventional CRC field and the retransmission mechanism built into may wireless link protocols. The mechanism of the present invention can be implemented on each side of a link autonomously with no coordination required between the two sides. Further, the mechanism does not require any modification to the PHY.

As an aid to the reader, a brief overview of CRC codes will now be described. A cyclic redundancy check (CRC) is a type of function that takes an input data stream of any length and produces as output value having a fixed size. The term CRC is often used to denote either the function or the output of the function. CRCs are used as a checksum to detect alteration of data during transmission or storage. CRCs are popular because they are simple to implement in binary hardware, are easy to analyze mathematically, and are particularly good at detecting common errors caused by noise in transmission channels.

A CRC is actually an error-detecting code whose computation resembles a long division computation in which the quotient is discarded and the remainder becomes the result. The length of the remainder is always less than the length of the divisor, which thus determines the length of the result.

CRCs are popular because they can detect the alteration of data. Typically, an n-bit CRC, applied to a data block of arbitrary length, can detect any single error burst not longer than n bits (in other words, any single alteration that spans no more than n bits of the data). They can also detect $1-2^{-n}$ of all longer error bursts. Since, errors in both data transmission channels and magnetic storage media tend to be distributed non-randomly (i.e. bursty), CRCs are more useful than alternative schemes such as multiple parity checks.

As an example, the 32-bit CRC-32 as applied to a WLAN packet is described below. The CRC-32 field (also referred to as a frame check sequence (FCS)) is a 32-bit field comprising a 32 bit CRC value. The FCS is calculated over all the fields of the MAC header and the frame body field (i.e. payload). These are referred as the calculation fields.

The FCS is calculated using the following standard generating polynomial of degree 32:

$$G(x)=x^{32}+x^{26}+x^{23}++x^{22}+x^{16}+x^{12}+x^{11}+x^{10}+x^8+x^7+x^5+x^4+x^2+x+1 \quad (1)$$

The FCS is a 1's compliment of the sum (modulo 2) of the following:
1. Multiplication of the message content represented as a polynomial "M(x)" by $x^{31}$ over the field $x^{32}$, i.e. this operation left shifts the message and pads with zeros on the right.
2. The above left shifted message content is than divided by G(x), where G(x) denotes the generating polynomial of the CRC code. The reminder of this division is defined as the CRC.

In mathematical terms, the CRC operation described above is represented as R(x) below:

$$x^m \cdot (M(x)) = Q(x) \cdot G(x) + R(x) = R(x) \mathrm{Mod}(x^m+1) \quad (2)$$

where
M(x) is the message the CRC calculation is performed on;
G(x) is the generator polynomial of the CRC code;
Q(x) is the quotient of the division (represented in a polynomial manner);
R(x) is the remainder portion of the results of the division, i.e. the CRC result;

Thus, we can express the remainder R(x) as follows:

$$R(x) = Rem\left\{\frac{x^m \cdot (M(x))}{G(x)}\right\} \quad (3)$$

where the operation "Rem{ }" denotes the mathematical remainder operation which is the residual portion of the division result. Note that the FCS field is transmitted commencing with the coefficients of the highest order term.

As a typical implementation, at the transmitter, the initial reminder of the division is preset to all 1's and is then modified by division of the calculation fields by the generator polynomial G(x). The 1's complement of the remainder is transmitted, with the highest order bit first, as the FCS field.

At the receiver, the initial remainder is preset to all 1's and the serial incoming bits of the calculation fields and FCS, when divided by G(x), results in a unique non zero remainder value in the absence of transmission errors. The unique remainder value is the polynomial:

$$G(x)=x^{31}+x^{30}+x^{26}+x^{25}++x^{24}+x^{18}+x^{15}+x^{14}+x^{12}+x^{11}+x^8+x^6+x^5+x^4+x^3+x+1 \quad (4)$$

Upon successful reception of a frame of a type that requires acknowledgment, the receiving node generates an ACK frame. The source node waits an ACK timeout amount of time without receiving an ACK frame before concluding that the transmission failed. All directed traffic uses immediate positive acknowledgement (ACK Frame) where retransmission is scheduled by the sender if no ACK is received. A retransmission is attempted for packets that have failed the ACK procedure one or more times. Retries for failed transmission attempts continue a certain number of times.

Figure 5:
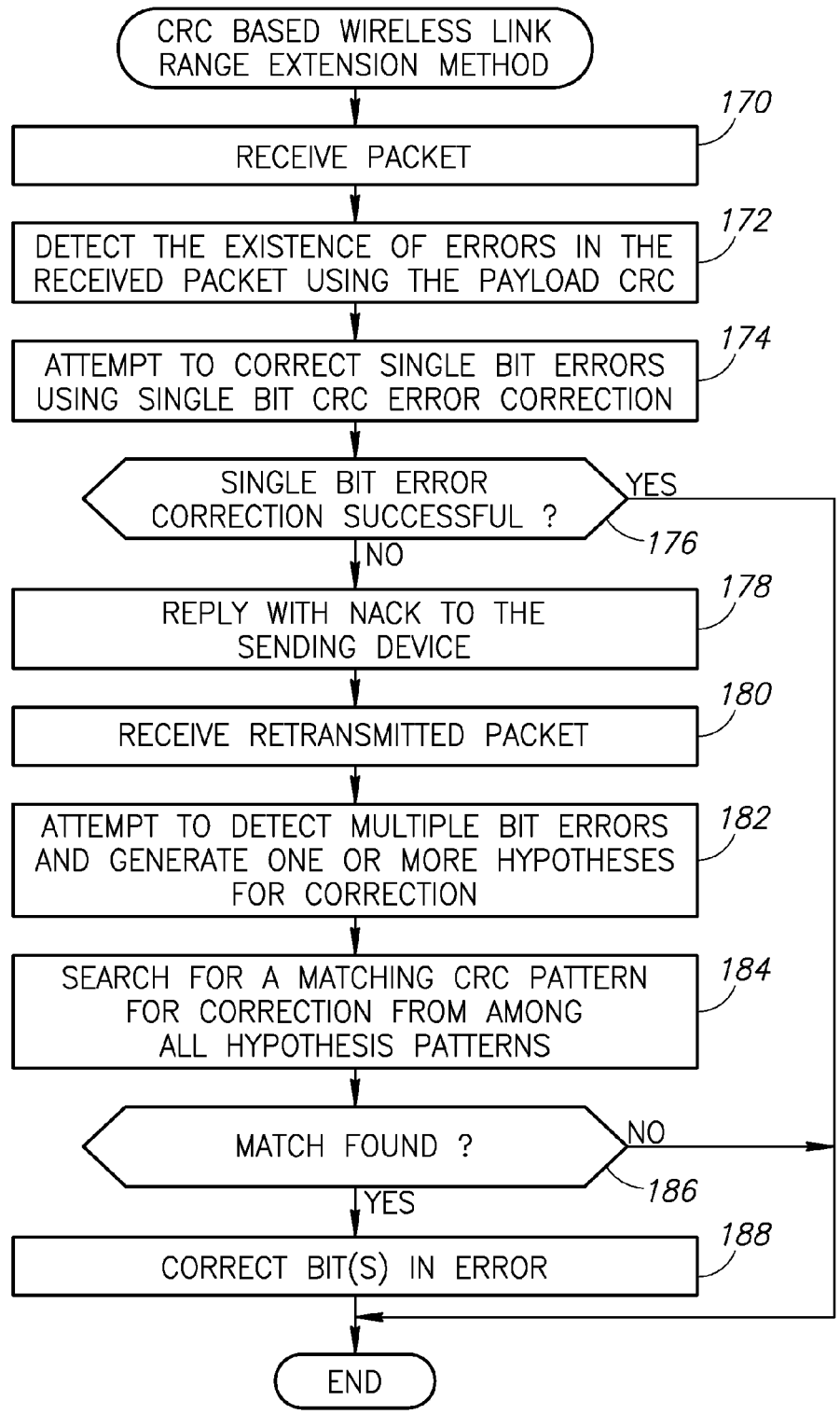
FIG. 5 is a flow diagram illustrating the CRC based wireless link range extension method of the present invention.

A flow diagram illustrating the CRC based wireless link range extension method of the present invention is shown in FIG. 5. For each received packet (step 170), the method detects the existence of errors using the payload CRC sent in the packet (step 172). An attempt is then made to correct any single bit errors found using a single bit CRC error correction scheme (described in more detail infra) (step 174).

If the single bit error correction attempt was not successful (step 176), a NACK reply is sent back to the sending device (step 178). Upon receipt of the retransmitted packet (step 180), the method attempts to detect multiple bit errors, generating one or more hypotheses for correction (step 182). The method then searches for a matching CRC pattern for correction from among all hypotheses patterns (step 184). If a match is found (step 186), the one or more bits found in error are corrected (step 188).

Figure 6:
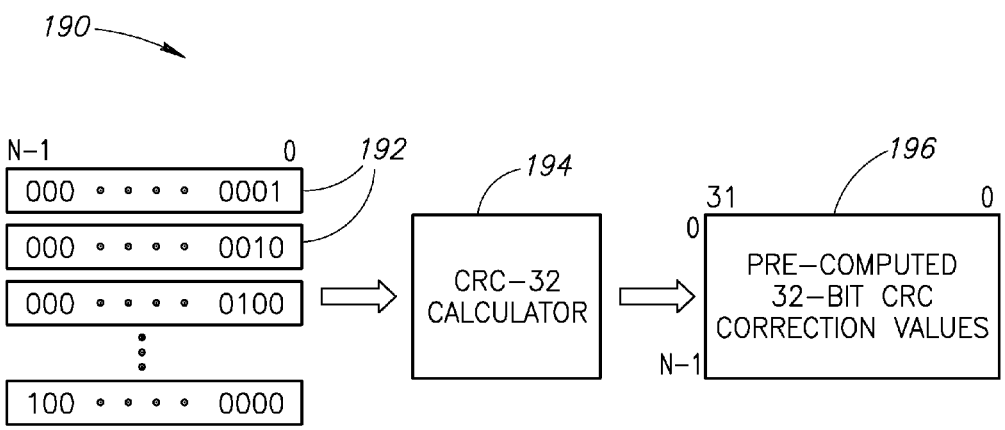
FIG. 6 is a diagram illustrating the generation of pre-computed CRC error correction values.
Figure 7:
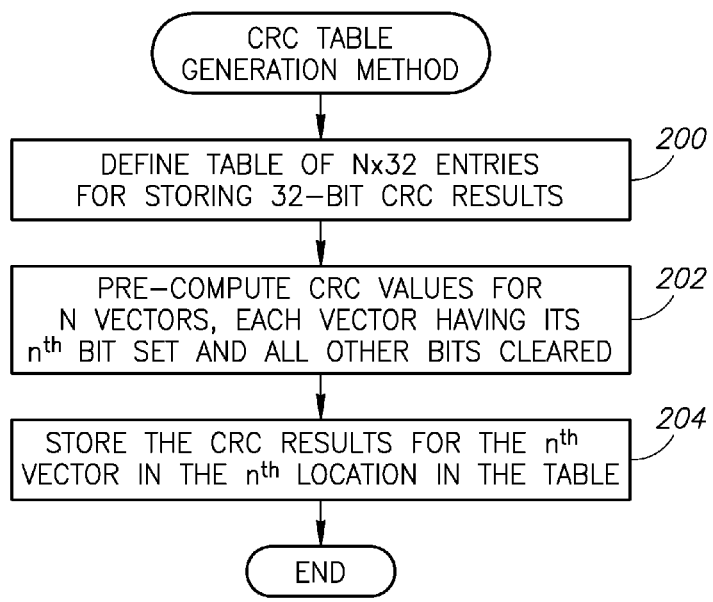
FIG. 7 is a flow diagram illustrating the method of generating pre-computed CRC error correction values.

The methods and algorithms described infra utilize CRC calculations of single bit errors. These CRC calculations are referred to as CRC correction values and can be pre-computed and stored in a table to speed execution of the algorithms. A diagram illustrating the generation of pre-computed CRC error correction values is shown in FIG. 6. A flow diagram illustrating the method of generating pre-computed CRC error correction values is shown in FIG. 7. The generation scheme, generally referenced 190, comprises a plurality of single bit error patterns 192, CRC calculator 194 and a table 196 to store the results of the CRC calculations.

With reference to FIGS. 6 and 7, in operation, a single bit pattern for each possible single bit error for the received packet is generated and passed through the CRC calculator 194. In the examples presented herein, the CRC codes and calculators use the CRC-32 (IEEE 802.3) standard. Further, for illustration purposes only, a received packet of length 1024 (i.e. the portion the CRC is calculated over) is assumed. It is appreciated that any other CRC standard, polynomial or packet length can be used as well without departing from the scope of the invention.

First a table for holding N×32 entries (N=1024 in this example) is defined (step 200). The N single bit patterns or vectors 0x00 . . . 001, 0x00 . . . 010, 0x00 . . . 100, etc. are generated and input to the CRC-32 calculator. Each vector having its $n^{th}$ bit (for n=1 to N) and all other bits cleared (step 202). The 32-bit CRC results output of the CRC calculator are stored in the pre-computed CRC correction values table 196, whereby the results for the $n^{th}$ vector are stored in the $n^{th}$ location in the table, i.e. the results for vector 0x00 . . . 001 stored in location 1, the results for vector 0x00 . . . 010 stored in location 2, the results for vector 0x00 . . . 100 stored in location 3, etc. (step 204).

Single Bit Error Correction

Method #1

As described supra, the mechanism of the present invention uses the conventional CRC error detection code to correct single bit errors. Two methods are described below that correct single bit errors in received packets. The linearity property of the CRC is exploited to provide error correction capabilities. The CRC results (i.e. the remainder portion of the division result with the code polynomial as described in Equation 3 supra) is a linear function and thus it maintains the following relationship:

$$CRC(Y_1+Y_2)=CRC(Y_1)+CRC(Y_2) \quad (5)$$

where $Y_1$ and $Y_2$ are two different transmitted or received vectors.

A mathematical proof that the CRC of a sum of two vectors is equal to the sum of the CRC of each vector separately as expressed in Equation 5 is provided below. We can express the CRC of the sum of two vectors $Y_1(x)+Y_2(x)$ as follows:

$$CRC(Y_1+Y_2) = Rem\{Y_1(x) + Y_2(x)\} = Rem\left\{\frac{Y_1(x) + Y_2(x)}{G(x)}\right\} \quad (6)$$

Since the division of $Y_1(x)+Y_2(x)$ is equal to the sum of division of $Y_1(x)$ by $G(x)$ and $Y_2(x)$ by $G(x)$, than the remainder of $Y_1(x)+Y_2(x)$ from the division by $G(x)$ can also be expressed as the remainder of $Y_1(x)$ from the division of $G(x)$ and the remainder of $Y_2(x)$ from the division by $G(x)$, as follows:

$$Rem\left\{\frac{Y_1(x) + Y_2(x)}{G(x)}\right\} = \quad (7)$$
$$Rem\left\{\frac{Y_1(x)}{G(x)}\right\} + Rem\left\{\frac{Y_2(x)}{G(x)}\right\} = CRC(Y_1) + CRC(Y_2)$$

Using this property, as described supra, CRC correction values for vectors $Y_n$ that have their $n^{th}$ bit set and all other bits cleared are pre-computed. Finding the effect of changing the $n^{th}$ bit on the CRC is performed by XORing the current CRC with the pre-computed value for the $n^{th}$ bit. For a packet length of 1024 bits and a 32-bit CRC, for example, a table of 1024×32 entries is created.

The above mechanism can be implied to a case where the received message $Y(x)$ is composed of the transmitted message $M(x)$ and a single bit error message $E(x)$ where the error resides in the $n^{th}$ bits. If the receiver suspects that the $n^{th}$ bit is possibly in error than this could be validated by XORing the calculated CRC result of the received message with the CRC results of the single bit error vector message $E(x)$ which is pre-calculated and stored in a table. This would be reflected as the following mathematical notation:

$$CRC(Y(x))+CRC(E(x))=CRC(M(x)) \quad (8)$$

Figure 8:
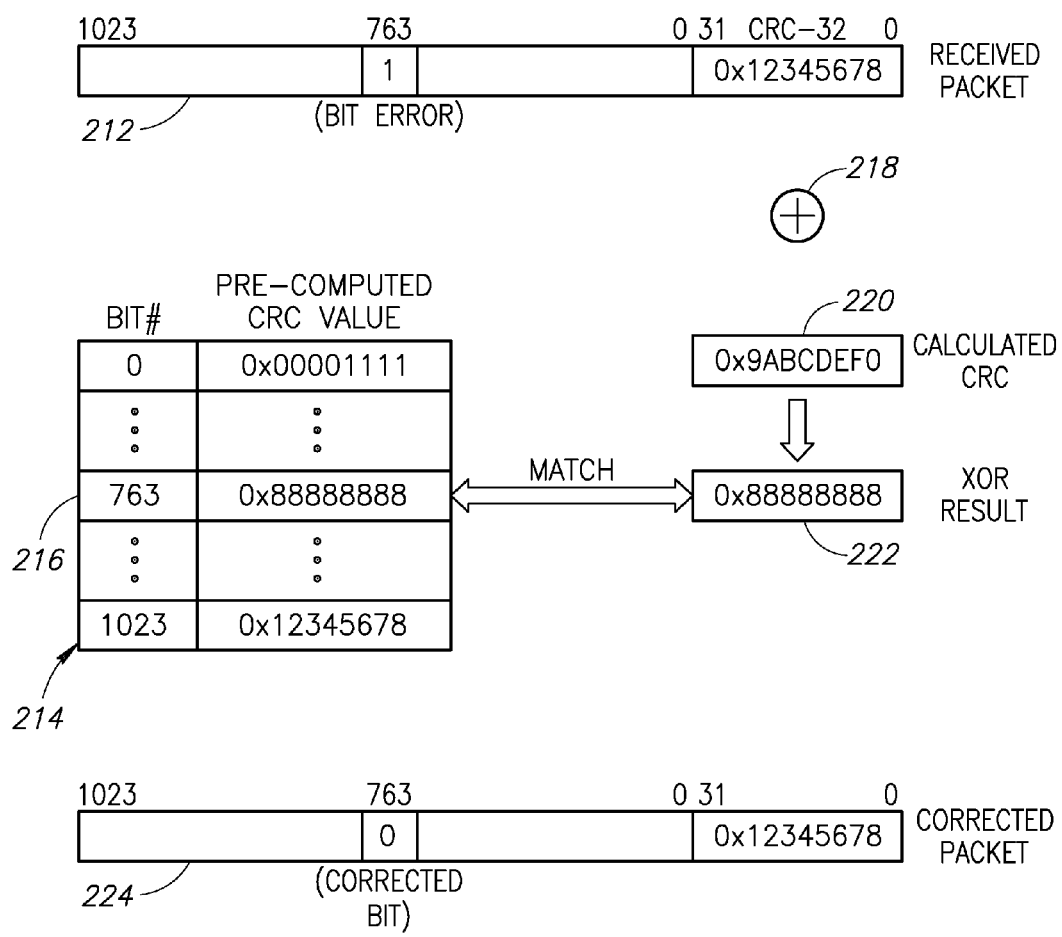
FIG. 8 is a diagram illustrating a first mechanism for correcting single bit errors using a conventional CRC code.

The mechanism of correcting single bit errors will now be described. A diagram illustrating a first mechanism for correcting single bit errors using a conventional CRC code is shown in FIG. 8. A flow diagram illustrating the first CRC based single bit error correction method of the present invention is shown in FIG. 9.

Figure 9:
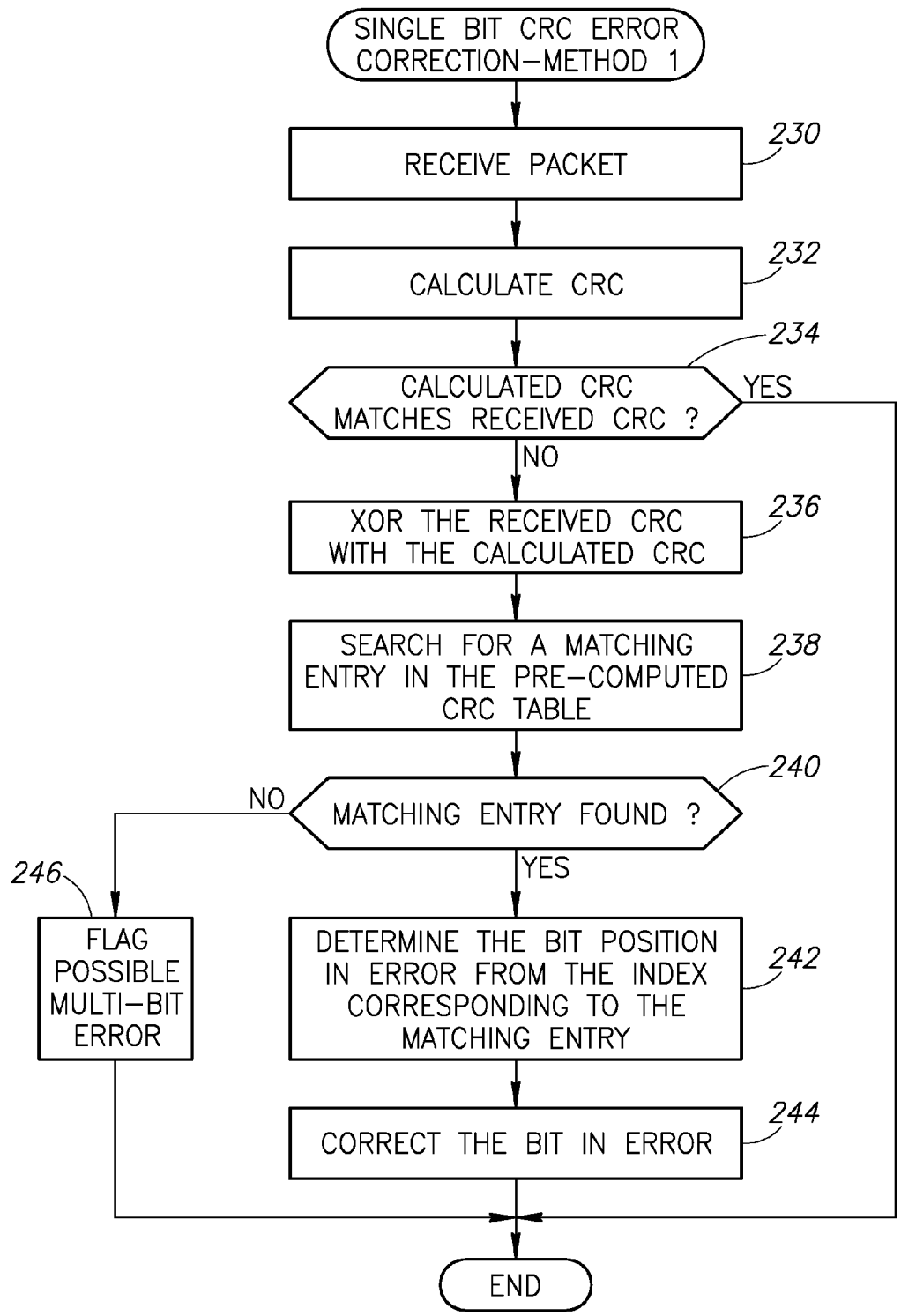
FIG. 9 is a flow diagram illustrating the first CRC based single bit error correction method of the present invention.

With reference to FIGS. 8 and 9, the received packet 212 (step 230) is assumed to arrive with a single bit error at bit position 763. A 32-bit CRC code (0x12345678) is appended at the end of the packet. A CRC-32 result 220 (0x9ABCDEF0) is calculated over the 1024 bits of the received packet (step 232). If the calculated CRC matches the received CRC than no errors are detected and the method ends (step 234). If the calculated CRC does not match the received CRC, then the received CRC is XORed (via XOR 218) with the calculated CRC value (step 236). This process of XORing the pre-computed CRC values stored in the table is continued until the result of the XOR is equal to the appended CRC result. The XOR result 222 (0x88888888) is used to search the table of pre-computed CRC values 214 for a matching entry (step 238). A matching entry 216 is found at location number 763. If a matching entry is found (step 240), the bit position in error is determined from the index corresponding to the matching entry (step 242). The bit in error (i.e. 763) is then corrected (i.e. flipped) to yield a corrected received packet 224 (step 244). If no matching entry is found (step 240), the method flags the received packet as possibly containing multiple bit errors (step 246).

Note that the table may be searched sequentially wherein each entry is compared to the XOR result, thus requiring a worst case N comparisons where N is the length of the packet (or the portion there of that the CRC is calculated over). Alternatively, a content addressable memory (CAM) can be used to quickly find the matching entry in a single cycle. In this case, an input of 0x88888888 causes the index 763 to be output. The index represents the bit position of the bit in error.

Single Bit Error Correction

Method #2

Figure 10:
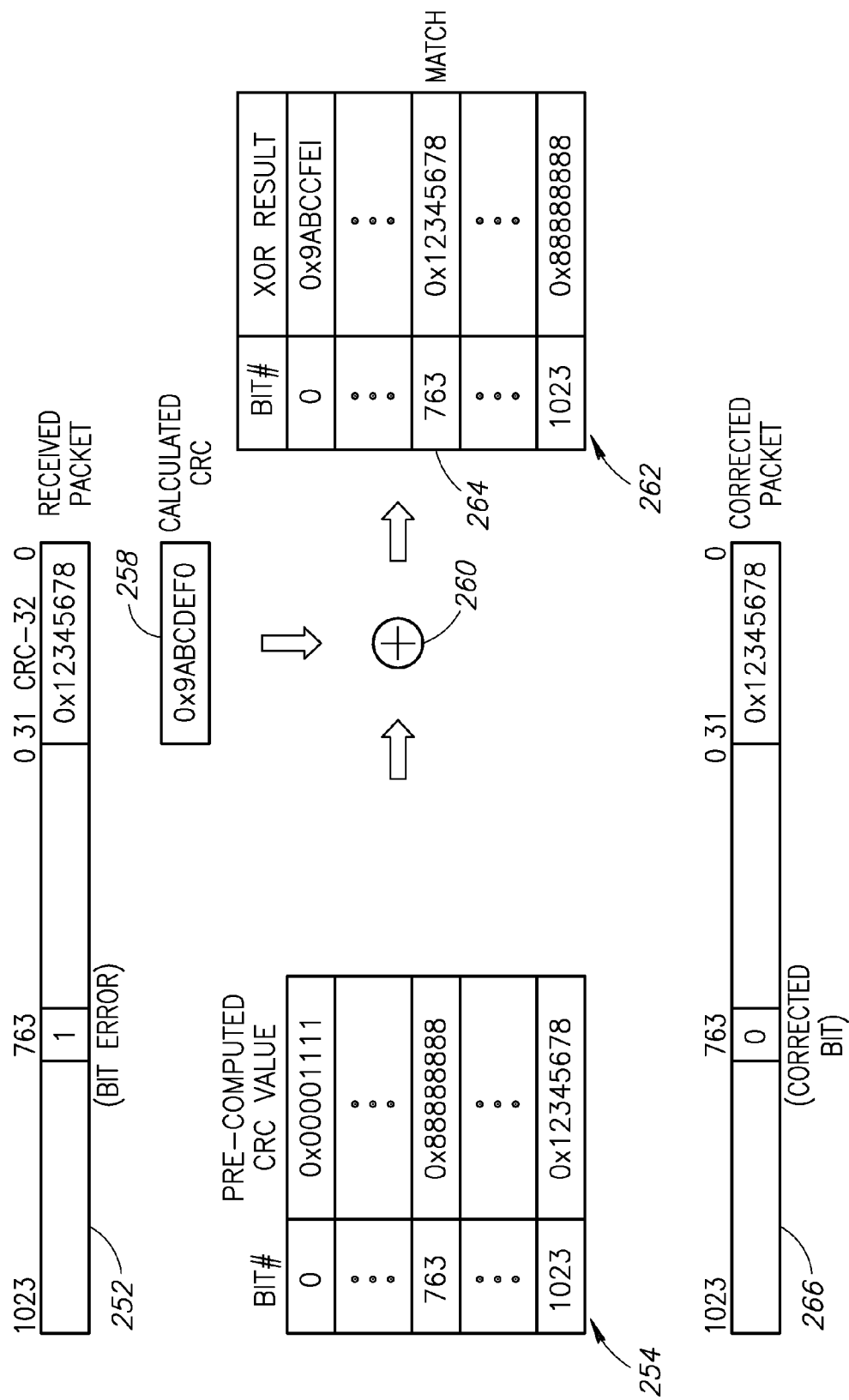
FIG. 10 is a diagram illustrating a second mechanism for correcting single bit errors using a conventional CRC code.
Figure 11:
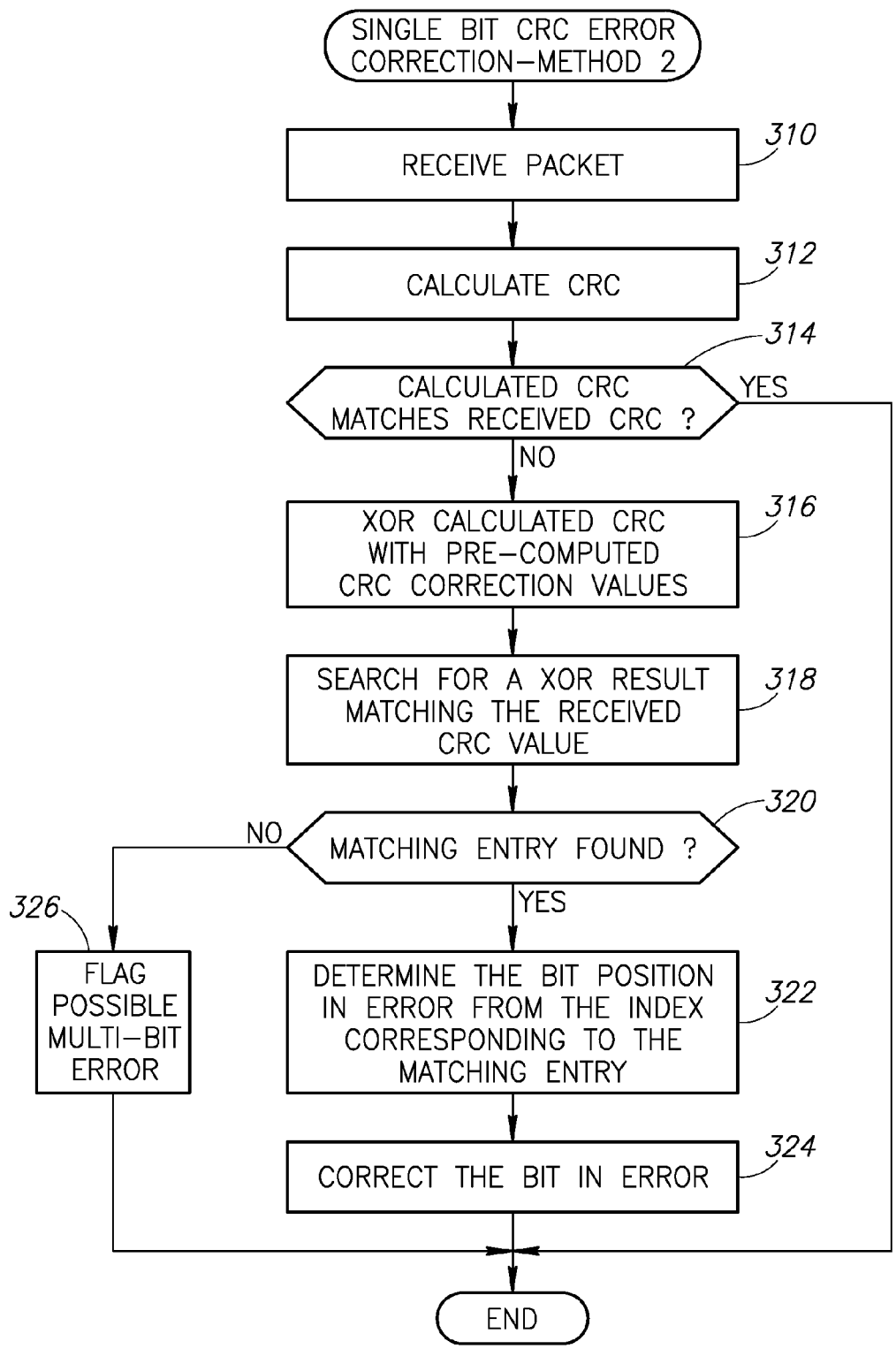
FIG. 11 is a flow diagram illustrating the second CRC based single bit error correction method of the present invention.

A second method of correcting single bit errors will now be described. A diagram illustrating a second mechanism for correcting single bit errors using a conventional CRC code is shown in FIG. 10. A flow diagram illustrating the second CRC based single bit error correction method of the present invention is shown in FIG. 11. In this second single bit error correction method, the calculated CRC is XORed with each entry of the table of pre-computed CRC values.

With reference to FIGS. 10 and 11, the received packet 252 (step 310) is assumed to arrive with a single bit error at bit position 763. A 32-bit CRC code (0x12345678) is appended at the end of the packet. A CRC-32 code 258 (0x9ABCDEF0) is calculated over the 1024 bits of the received packet (step 312). If the calculated CRC matches the received CRC than no errors are detected and the method ends (step 314). If the calculated CRC does not match the received CRC, then the calculated CRC is XORed (via XOR 260) with the pre-computed CRC correction values in table 254 (step 316). The XOR results (table 262) are searched for an entry matching the received CRC value (step 318). In this example, a matching entry 264 is found with corresponding location 763. If a matching entry is found (step 320), the bit position in error is determined from the index corresponding to the matching entry in table 262 (or table 254) (step 322). The bit in error (i.e. 763) is then corrected (i.e. flipped) to yield a corrected received packet 266 (step 324). If no matching entry is found (step 320), the method flags the received packet as possibly containing multiple bit errors (step 326).

Single Bit Error Correction

Method #3

Figure 12:
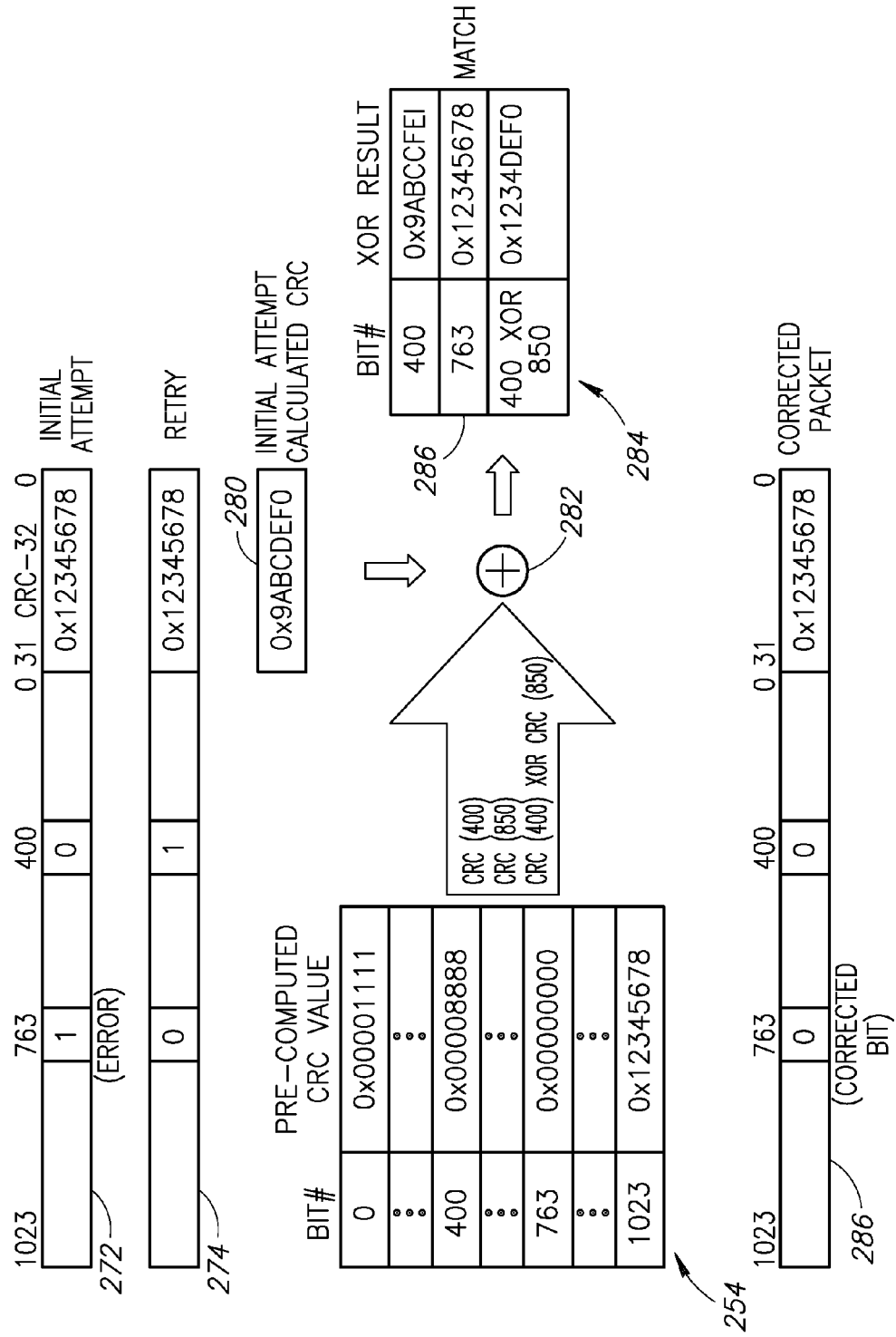
FIG. 12 is a diagram illustrating a third mechanism for correcting single bit errors using a conventional CRC code.

A third method of correcting single bit errors will now be described. This method is useful in order to reduce the number of CRC calculations suggested in the second method described supra. A diagram illustrating a third mechanism for correcting single bit errors using a conventional CRC code is shown in FIG. 12. A flow diagram illustrating the third CRC based multiple bit error correction method of the present invention is shown in FIG. 13.

Figure 13:
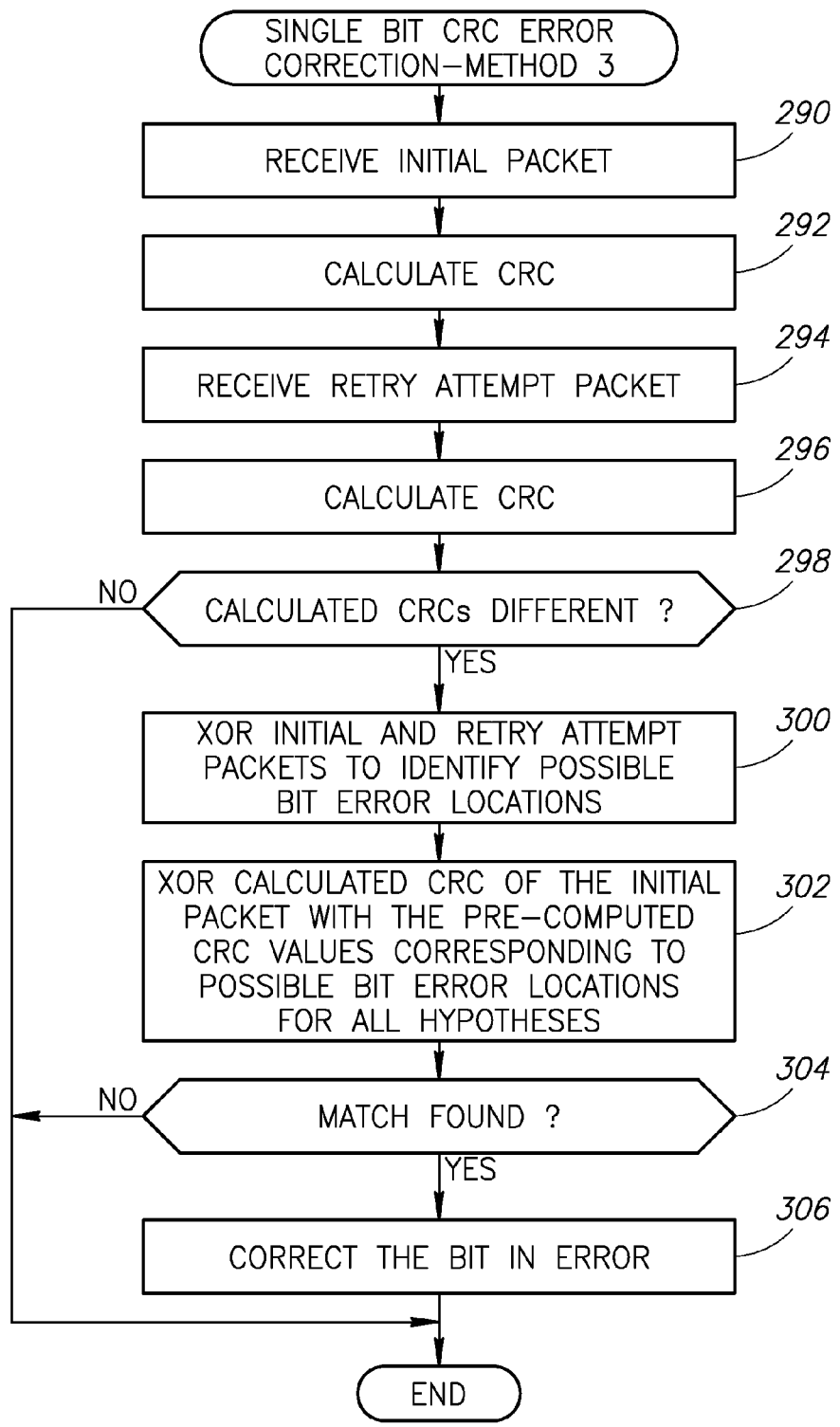
FIG. 13 is a flow diagram illustrating the third CRC based single bit error correction method of the present invention.

With reference to FIGS. 12 and 13, the initial received packet 272 (step 290) is assumed to arrive with a single bit error at bit position 763. A 32-bit CRC code (0x12345678) is appended at the end of the packet. An initial attempt CRC-32 code 280 (0x9ABCDEF0) is calculated over the 1024 bits of the initial received packet (step 292). Assume that in this case, a NACK reply was sent to the sender device and a retransmitted packet is received (step 294). A CRC is calculated on the retransmitted packet (step 296). If the calculated CRC values do not match (step 298), it means one or more bits are in error.

In this case, the initial and attempted retry packets are XORed to identify the possible bit error locations (i.e. a tie vote) (step 300). In this example, the XOR operation identifies bit locations 763 and 400 as possible bit errors. The calculated CRC of the initial received packet is then XORed with the pre-computed CRC values corresponding to all possible bit error locations (e.g., 400, 763 and a combination of 400, 763) via XOR 282 to yield an XOR result table 284 (step 302). Each possible error is referred to as a hypothesis. The hypotheses are identified by XORing the first received packet and the second re-transmitted packet. All non-zero results indicate a possible bit error location. In this example, the possible bit error locations are 400, 763 and a combination of 400 and 850 (i.e. a 2-bit error may have occurred). Thus, three possible error location hypotheses are checked by XORing their corresponding CRC value with the calculated CRC value of the initial received packet (i.e. initial attempt calculated CRC) and then comparing the XOR result to the CRC appended in the received packet. The corresponding CRC values and bit locations for the three hypotheses are as follows:

1. CRC correction value 0x00008888 corresponding to bit 400;
2. CRC correction value 0x88888888 corresponding to bit 763;
3. CRC correction value 0x00008888 XORed with CRC correction value 0x88888888 (representing errors at bit location 400 and 763);

If a match is found (step 304), the corresponding bit in error is corrected (step 306). Thus, in this example, the XOR value of 0x88888888 (corresponding to bit 763) matches the appended CRC value transmitted with the packet. Therefore, a single bit error in location 850 is corrected to yield the corrected received packet 286.

It should be noted that the use of this method #3 significantly reduces the number of CRC calculation required so as to cover only a set of hypothesis that represent the number of possible bit errors detected by the XOR of the first received packet and re-transmitted packet. In contrast with the method #2 described supra, wherein CRC calculations are done as long as the calculated CRC does not match the CRC appended to the received packet (i.e. the entire pre-calculated table must be scanned), this method #3 requires only a small subset of calculations.

Note that in the example presented in FIG. 12, only a single bit in both the initial and retransmitted packet was in error. In this case, there are only three hypotheses to check. This is in contrast to the 763 calculations that would have been required using method #2.

Multiple Bit Error Correction

Method #4

A fourth method suitable for multiple bit errors contained in one received packet will now be described. At first, a description will be provided on multiple error correction when the errors occur at different locations in the original received packet and in the re-transmitted packet. This is followed by a description for the special case where multiple bit errors occur in the same bit location in the received and re-transmitted packets.

Figure 14:
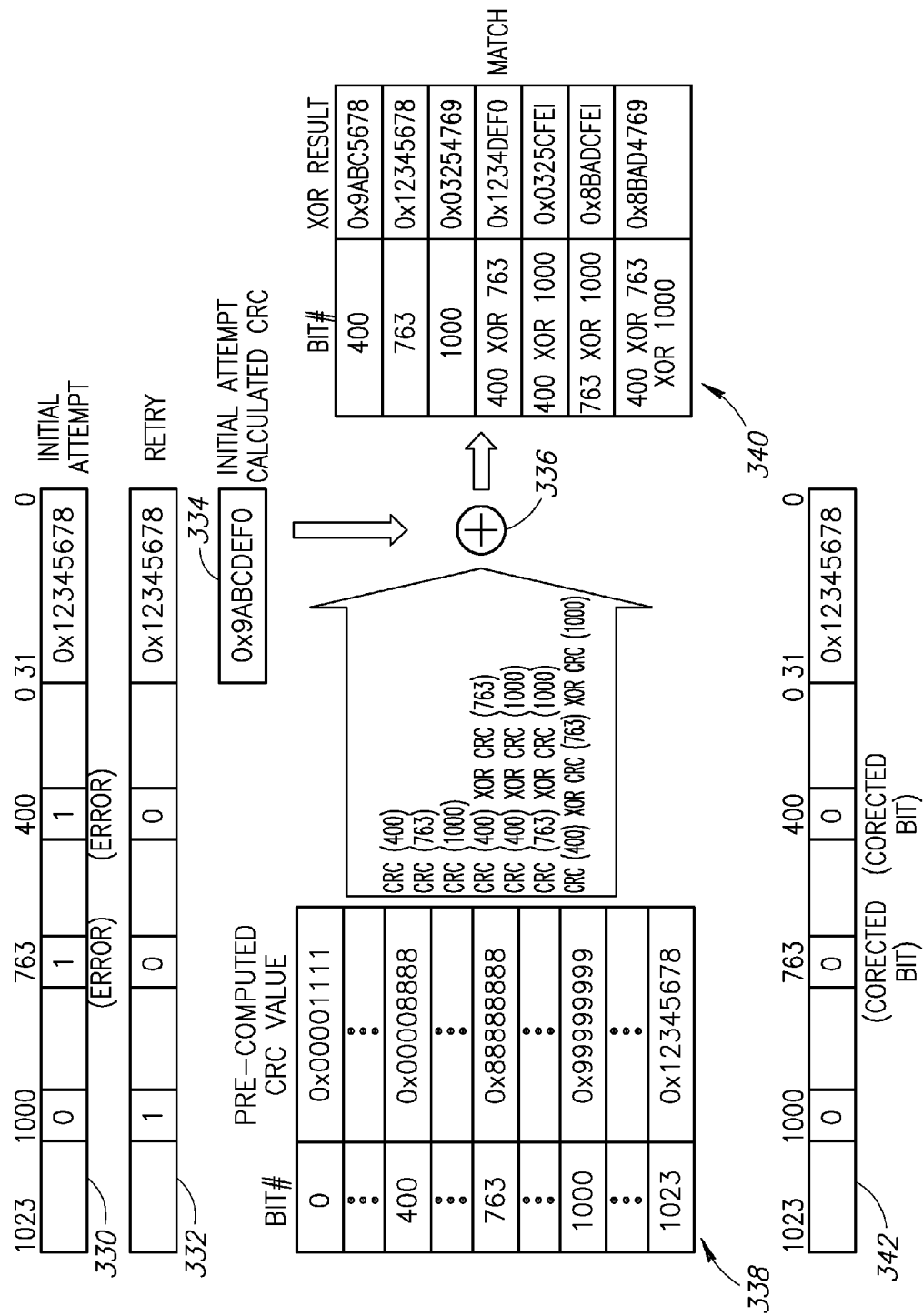
FIG. 14 is a diagram illustrating a fourth mechanism for correcting multiple bit errors using a conventional CRC code.

A diagram illustrating a fourth mechanism for correcting multiple bit errors using a conventional CRC code is shown in FIG. 14. A flow diagram illustrating the fourth CRC based multiple bit error correction method of the present invention is shown in FIG. 15.

Figure 15:
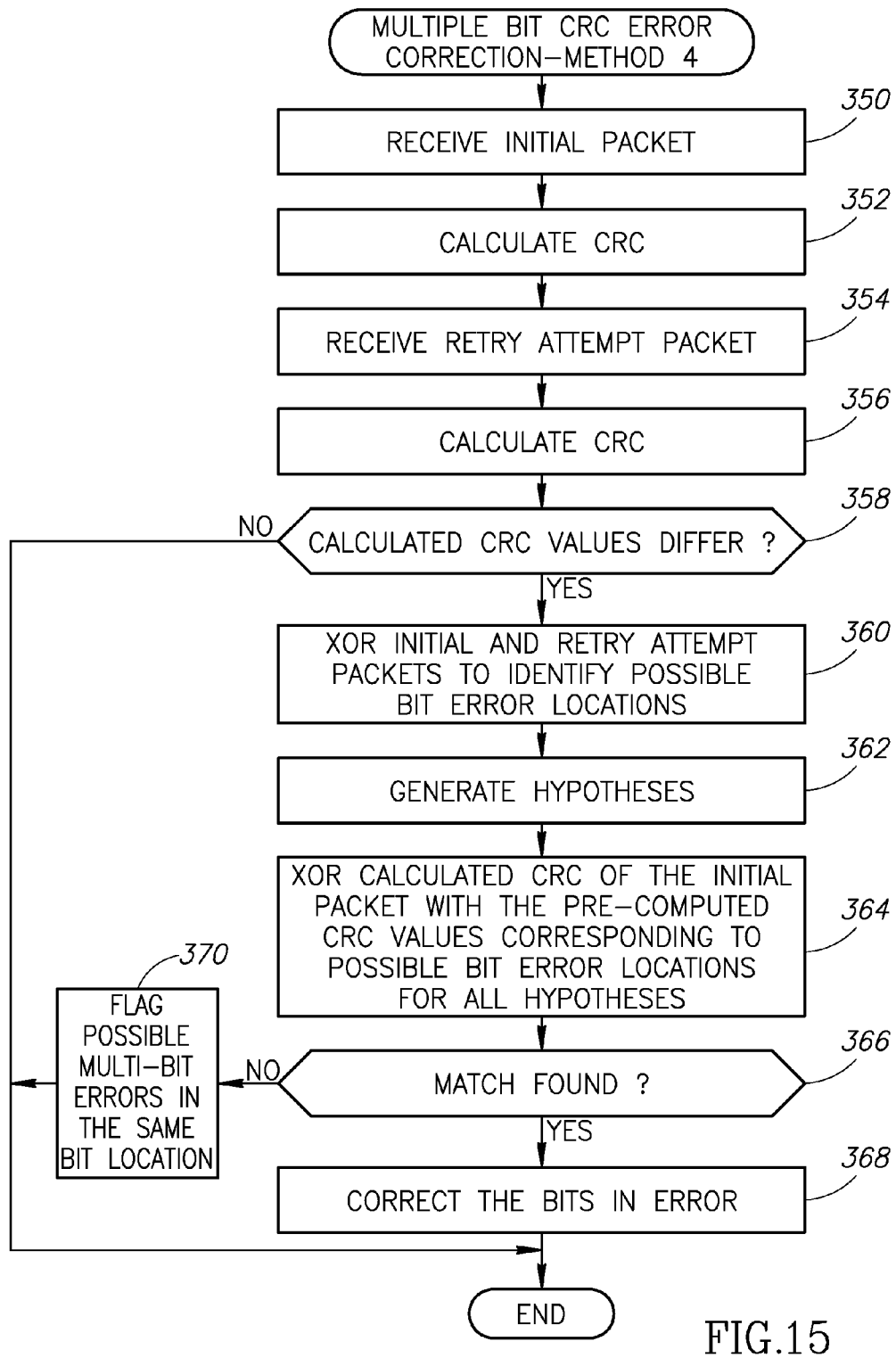
FIG. 15 is a flow diagram illustrating the fourth CRC based multiple bit error correction method of the present invention.

With reference to FIGS. 14 and 15, the initial received packet 330 (step 350) is assumed to arrive with multiple bit errors at bit locations 400 and 763. A 32-bit CRC code (0x12345678) is appended at the end of the packet. An initial attempt CRC-32 code 334 (0x9ABCDEF0) is calculated over the 1024 bits of the initial received packet (step 352). Assume that in this case, a NACK reply was sent to the sender device and a retransmitted packet 332 is received with a bit error in location 1000 (step 354). A CRC is calculated on the retransmitted packet (step 356). If the calculated CRC values do not match (step 358), it means one or more bits are in error. If they do match, the method ends since no errors are detected.

The initial attempted and retransmission packets are then XORed to identify the possible bit error locations (step 360). In this example, the XOR operation identifies bit locations 400, 763 and 1000. A plurality of hypotheses are then generated (step 362). In this example, there are seven hypotheses. They include all combinations of the three possible bit errors locations as follows.

1. CRC correction value 0x00008888 corresponding to an error at bit location 400;
2. CRC correction value 0x88888888 corresponding to an error at bit location 763;
3. CRC correction value of 0x99999999 corresponding to an error at bit location 1000;
4. CRC correction value 0x00008888 XORed with CRC correction value 0x88888888, corresponding to errors at bit locations 400 and 763;
5. CRC correction value 0x00008888 XORed with CRC correction value 0x99999999, corresponding to bit errors at bit locations 400 and 1000;
6. CRC correction value 0x88888888 XORed with CRC correction value 0x99999999, corresponding to bit errors at bit locations 763 and 1000;
7. CRC correction value 0x00008888 XORed with CRC correction value 0x88888888 XORed with CRC correction value 0x99999999, corresponding to bit errors at bit locations 400, 763 and 1000.

The hypotheses are calculated using the CRC values in the pre-computed CRC correction value table 338. The CRC calculation corresponding to each hypothesis is XORed (via XOR 336) with the initial attempt calculated CRC to generate a CRC result. The results of each of these XOR operations (table 340) is then compared to the appended CRC in the receive packet (step 364). If a match is found (step 366), the corresponding bit (or bits) in error are corrected. Thus, in this example, the correction value of 0x00008888 XORed with correction value 0x88888888 (corresponding to errors at bit locations 400 and 763) matches the appended CRC value. Therefore, the two bit errors in locations 400 and 763 are corrected (i.e. flipped) to yield the corrected received packet 342. If no matching entry is found, the method flags the received packet as possibly containing multiple bit errors but in the same bit location in the first transmitted and re-transmitted packets.

Multiple Bit Error Correction

Method #5

Figure 16:
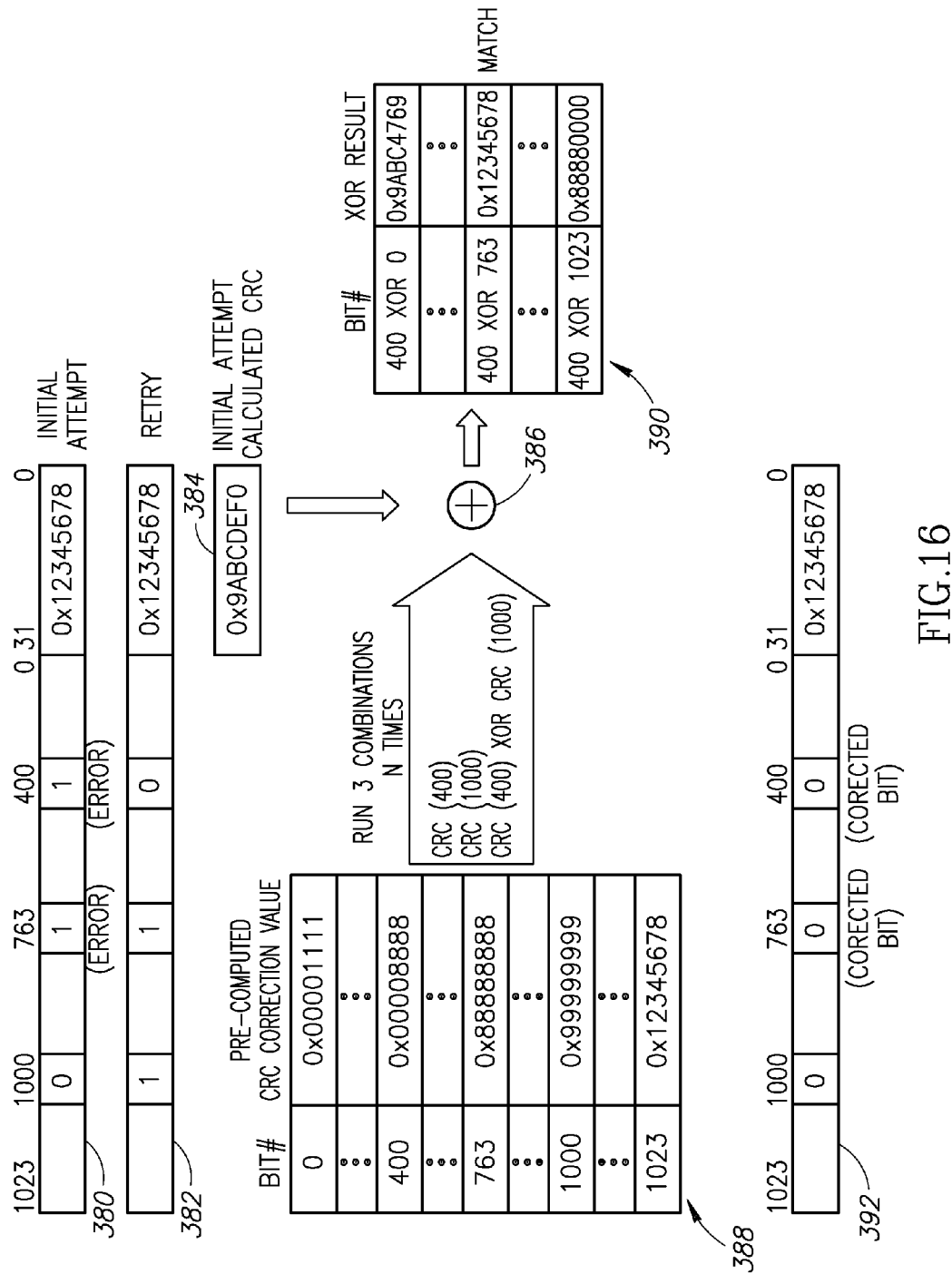
FIG. 16 is a diagram illustrating a fifth mechanism for correcting multiple bit errors using a conventional CRC code.

A fifth method suitable for multiple bit errors contained in a single packet wherein one of these errors is identical in both initial received packet and retransmitted packet will now be described. A diagram illustrating a fifth mechanism for correcting multiple bit errors using a conventional CRC code is shown in FIG. 16. A flow diagram illustrating the fifth CRC based multiple bit error correction method of the present invention is shown in FIG. 17.

Figure 17:
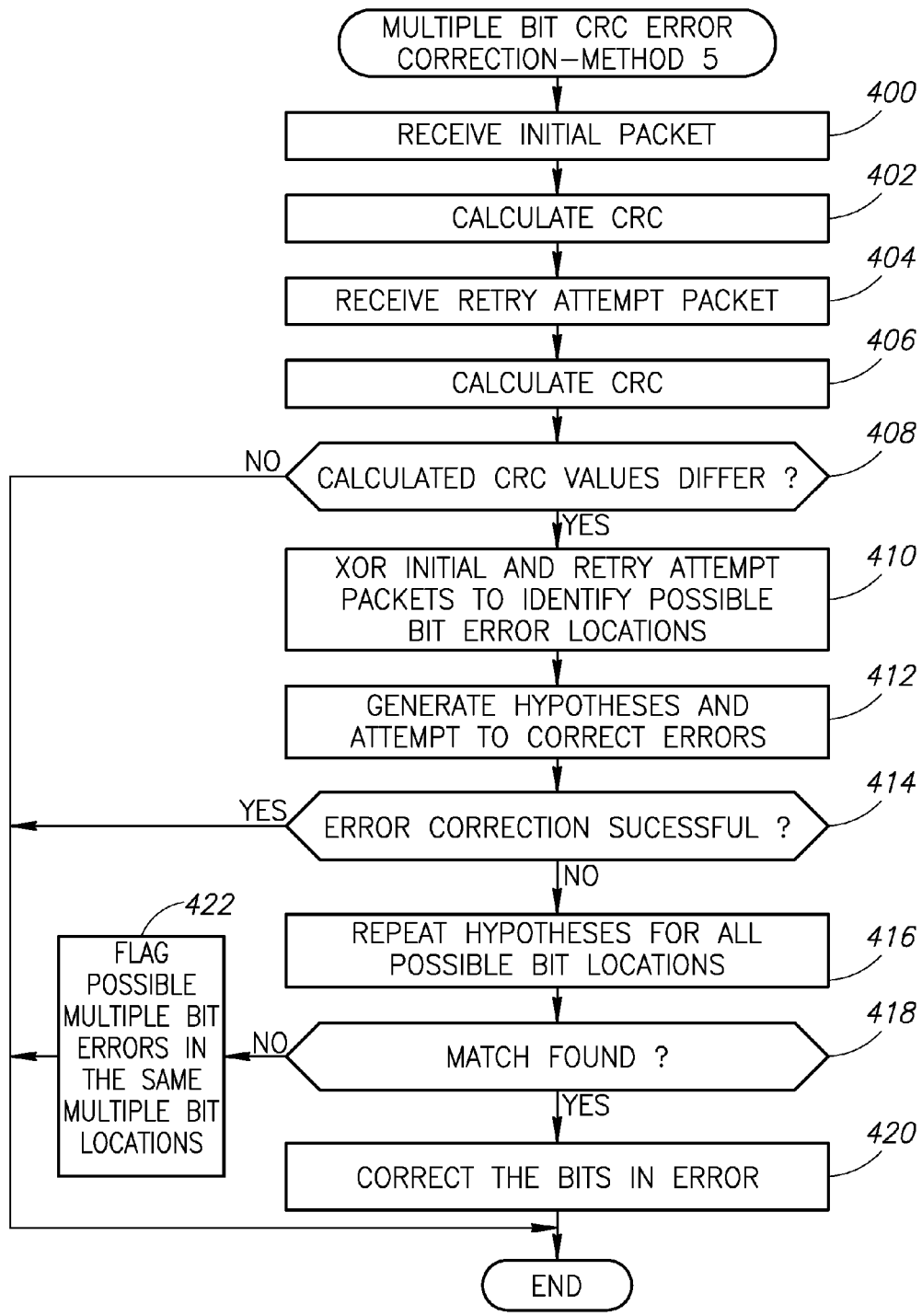
FIG. 17 is a flow diagram illustrating the fifth CRC based multiple bit error correction method of the present invention.

With reference to FIGS. 16 and 17, the initial received packet 380 (step 400) is assumed to arrive with multiple bit errors at bit locations 400 and 763. A 32-bit CRC code (0x12345678) is appended at the end of the packet. An initial attempt CRC-32 code 384 (0x9ABCDEF0) is calculated over the 1024 bits of the initial received packet (step 402). Assume that in this case, a NACK reply was sent to the sender device and a retransmitted packet is received (step 404). In the retransmitted packet 382, however, bit locations 763 and 1000 are in error. A CRC is calculated on the retransmitted packet (step 406). If the calculated CRC values do not match (step 408), it means one or more bits are in error.

In this fifth embodiment, it is assumed that the XOR result of the initial and attempted retry packets, did not uncover include all possible bit error locations since one or more error locations were repeated in the retransmitted packet. In this example, although the XOR operation identifies bit locations 400, and 1000 as possible bit errors, bit 763 is not identified (step 410). In this case, three hypotheses are examined in accordance with method 4 (FIGS. 14 and 15) (step 412). The three hypotheses correspond to (1) an error at bit 400, (2) an error at bit 1000, or (3) an error at bits 400 and 1000. Since none of these hypotheses represent the actual case which includes errors at bit locations 400 and 763 of the original received packet, the attempt to correct any errors will not be successful (step 414).

To overcome the repeating error problem, the three hypotheses are repeated for all possible bit locations in the packet (step 416) until a match is found (step 418). For an N-bit packet, the method performs the three CRC calculations N times. This effectively searches for the 'missing' bit error since its location is not known. To discover it, each hypothesis CRC value is XORed (via XOR 386) with the pre-computed CRC correction value for each bit location in the packet (XOR results table 390). Thus, the first hypothesis is XORed with the pre-computed CRC correction value for bit 1, bit 2, ..., bit N. Then, the second hypothesis is XORed with the pre-computed CRC correction value for bit 1, bit 2, ..., bit N, and so on until the last hypothesis.

In the particular example presented herein, once the original hypothesis check (step 412) did not result in a match to the appended CRC, each hypothesis is applied against the N=1024 bits of the packet. Thus, the pre-computed CRC correction value 0x00008888 (corresponding to the first hypothesis of an error at bit location 400) is XORed with entry 1, entry 2, ..., entry N of the pre-computed CRC correction value table 388. Next, if no match is found, the pre-computed CRC correction value 0x99999999 (corresponding to the second hypothesis of an error at bit location 1000) is XORed with entry 1, entry 2, ..., entry N. If still no match is found, the pre-computed CRC correction value 0x99991111 (corresponding to the second hypothesis of an error at bit locations 400 and 1000) is XORed with entry 1, entry 2, ..., entry N. In this example, the algorithm finds a match in the first hypothesis (corresponding to bit location 400) when the search reaches bit 763 (CRC correction value of 0x88888888). Since the errors are actually in bits 400 and 763, the XOR of the combination of bit errors in locations 400 and 763 with the initial attempt calculated CRC value matches the received appended CRC value 0x12345678.

Once a matching entry is found (step 418), the bits in error are corrected (step 430). The first bit position to correct is determined by the value of the hypothesis that is examined (i.e. the first hypothesis corresponding to bit 400). The second bit position in error is determined from the index corresponding to the matching entry. In this example, the bit in error determined from the matching entry from the table (e.g., bit 763) as well as bit location 400 matching the checked hypothesis are corrected (i.e. flipped) to yield a corrected received packet 392. If no matching entry is found (step 418), the received packet is flagged as possibly containing multiple bit errors in the same multiple bit locations (step 422).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of correcting one or more bit errors in a received packet, said method comprising the steps of:
    calculating a cyclic redundancy check (CRC) code for an initial received packet;
    utilizing a retransmitted packet to detect the presence of one or more bit errors;
    generating a plurality of hypotheses to check, each hypothesis represented by a CRC value;
    XORing said calculated CRC code with the CRC value associated with each hypothesis to generate a plurality of XOR results therefrom;
    searching for a match between said plurality of XOR results and a received CRC code; and
    if a match is found, flipping the value of the bit at one or more bit locations in said initial received packet corresponding to one or more bit numbers of a matching XOR result thereby correcting said one or more bit errors.

2. The method according to claim 1, wherein an error correction code of the CRC corrects single bit errors in a received packet.

3. The method according to claim 1, further comprising the step of using one or more packet retransmissions to further improve probability of reception.

4. The method according to claim 1, further comprising the step of using one or more packet retransmissions to correct multiple bit errors in a received packet.

5. The method according to claim 1, wherein a step of determining a bit error location in accordance with the XOR result further comprises searching a table of pre-computed single bit error CRC correction values for an entry matching said XOR result, wherein said bit error location corresponds to the bit location corresponding to said matching entry.

6. The method according to claim 5, wherein said single bit error is corrected in a single CRC cycle.

7. The method according to claim 1, wherein a plurality of single bit error CRC correction values are pre-computed for all possible single bit error locations.

8. The method according to claim 7, wherein said plurality of single bit error CRC correction values are pre-computed for all possible single bit error locations.

9. The method according to claim 1, wherein a single bit error is corrected in a single CRC cycle.

10. The method according to claim 1, wherein each hypothesis is calculated a plurality of single bit error CRC correction values pre-computed for all possible single bit error locations.

11. The method according to claim 1, wherein said one or more bit errors are corrected in a single CRC cycle.

12. A method of correcting multiple bit errors in a received packet, said method comprising the steps of:
   calculating a cyclic redundancy check (CRC) code for an initial received packet;
   utilizing a retransmitted packet to detect the presence of multiple bit errors;
   generating a plurality of hypotheses to check, each hypothesis represented by a CRC value;
   for each bit position in said received packet, XORing the CRC value of each hypothesis with both a single bit error CRC correction value associated with a particular bit position and said calculated CRC code to generate XOR results therefrom;
   searching for a match between said plurality of XOR results and a received CRC code for each bit position in said received packet; and
   if a match is found, flipping the value of the bit at the bit location in said initial received packet corresponding to the location of the matching tested bit and the value of one or more bits corresponding to the matching hypothesis thereby correcting said multiple bit errors.

13. The method according to claim 12, wherein each hypothesis is calculated a plurality of single bit error CRC correction values pre-computed for all possible single bit error locations.

14. The method according to claim 12, wherein said multiple bit errors are corrected in a single CRC cycle.

15. The method according to claim 12, wherein said search is halted once an XOR result associated with a hypothesis is found that matches said received CRC code.

16. A software program product embodied in a computer-readable medium, comprising program instructions executable to implement:
   a range extension and noise mitigation mechanism operative to use a packet cyclic redundancy check (CRC) error detection code as an error correction code to correct one or more bit errors in a received packet, said software product program employable to:
     calculate a cyclic redundancy check (CRC) code for an initial received packet;
     utilize a retransmitted packet to detect the presence of multiple bit errors;
     generate a plurality of hypotheses to check, each hypothesis represented by a CRC value;
     for each bit position in said received packet, XOR the CRC value of each hypothesis with both a single bit error CRC correction value associated with a particular bit position and said calculated CRC code to generate XOR results therefrom;
     search for a match between said plurality of XOR results and a received CRC code for each bit position in said received packet; and
     if a match is found, flip the value of the bit at the bit location in said initial received packet corresponding to the location of the matching tested bit and the value of one or more bits corresponding to the matching hypothesis thereby correcting said multiple bit errors.

17. A single chip radio controller, comprising:
   a radio for establishing a link to a remote device; and
   a range extension and noise mitigation mechanism operative to use a packet cyclic redundancy check (CRC) error detection code as an error correction code to correct one or more bit errors in a received packet, said software product program employable to:
     calculate a cyclic redundancy check (CRC) code for an initial received packet;
     utilize a retransmitted packet to detect the presence of multiple bit errors;
     generate a plurality of hypotheses to check, each hypothesis represented by a CRC value;
     for each bit position in said received packet, XOR the CRC value of each hypothesis with both a single bit error CRC correction value associated with a particular bit position and said calculated CRC code to generate XOR results therefrom;
     search for a match between said plurality of XOR results and a received CRC code for each bit position in said received packet; and
     if a match is found, flip the value of the bit at the bit location in said initial received packet corresponding to the location of the matching tested bit and the value of one or more bits corresponding to the matching hypothesis thereby correcting said multiple bit errors.

18. The radio according to claim 17, wherein said error correction code corrects single bit errors in a received packet.

19. The method according to claim 12, further comprising the step of using one or more packet retransmissions to further improve probability of reception.

20. The method according to claim 12, further comprising the step of using one or more packet retransmissions to correct multiple bit errors in a received packet.

* * * * *